(12) United States Patent
Tsuchiyama et al.

(10) Patent No.: US 12,554,205 B2
(45) Date of Patent: Feb. 17, 2026

(54) SUBSTRATE TREATMENT SYSTEM AND SUBSTRATE TREATMENT METHOD

(71) Applicant: Tokyo Electron Limited, Tokyo (JP)

(72) Inventors: Masashi Tsuchiyama, Koshi (JP); Taro Yamamoto, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 187 days.

(21) Appl. No.: 18/355,918

(22) Filed: Jul. 20, 2023

(65) Prior Publication Data
US 2024/0036482 A1 Feb. 1, 2024

(30) Foreign Application Priority Data
Jul. 28, 2022 (JP) ................. 2022-120823

(51) Int. Cl.
*G03F 7/20* (2006.01)
*G03F 7/00* (2006.01)

(52) U.S. Cl.
CPC .................. *G03F 7/7075* (2013.01)

(58) Field of Classification Search
CPC ............... G03F 7/7075; G03F 7/70991; H01L 21/67155; H01L 21/0276; H01L 21/32; H01L 21/67069; H01L 21/6715; H01L 21/67703; H01L 21/67763; H01L 21/0274; B65G 49/07
See application file for complete search history.

(56) References Cited

U.S. PATENT DOCUMENTS

2007/0117400 A1* 5/2007 Matsuoka ......... H01L 21/67173
438/758

FOREIGN PATENT DOCUMENTS

JP 2013-069874 A 4/2013

* cited by examiner

*Primary Examiner* — Mesfin T Asfaw
(74) *Attorney, Agent, or Firm* — Posz Law Group, PLC

(57) ABSTRACT

A substrate treatment system includes a wet system, a dry system, and a relay transfer system. The wet system has a wet treatment apparatus which performs in a wet mode one of substrate treatments from a formation treatment of a resist film to a developing treatment of the resist film after exposure, and is coupled to an exposure apparatus. The dry system has a dry treatment apparatus which performs in a dry mode a same kind of substrate treatment by the wet treatment apparatus. The relay transfer system transfers the substrate between the wet system and the dry system. When viewed from a coupling direction, the wet system is arranged such that the exposure apparatus projects from one side in a depth direction perpendicular to the coupling direction in top view; and the dry system is adjacent to the one side of the wet system in the depth direction.

18 Claims, 14 Drawing Sheets

_US 12,554,205 B2_

SUBSTRATE TREATMENT SYSTEM AND SUBSTRATE TREATMENT METHOD

CROSS REFERENCE TO RELATED APPLICATIONS

This application is based upon and claims the benefit of priority of the prior Japanese Patent Application No. 2022-120823, filed in Japan on Jul. 28, 2022, the entire contents of which are incorporated herein by reference.

TECHNICAL FIELD

This disclosure relates to a substrate treatment system and a substrate treatment method.

BACKGROUND

Japanese Laid-open Patent Publication No. 2013-69874 discloses a substrate treatment system including a treatment station in which a plurality of treatment units for treating the substrate are provided at multiple stages in the up-down direction, a cassette mounting part on which a cassette housing a plurality of substrates is mounted, and a substrate transfer mechanism arranged between the treatment station and the cassette mounting part. Between the treatment station and the substrate transfer mechanism, a plurality of delivery units which temporarily store the substrates to be transferred between the cassette mounting part and the treatment station and the substrates to be transferred between the stages of the treatment units are provided at multiple stages. Further, the substrate transfer mechanism includes a first transfer arm which transfers the substrate between the cassette mounting part and each of the delivery units and a second transfer arm which transfers the substrate between the stages of each of the delivery units.

SUMMARY

An aspect of this disclosure is a substrate treatment system including: a wet treatment system having a wet treatment apparatus configured to perform in a wet mode one of substrate treatments from a formation treatment of a resist film on a substrate to a developing treatment of the resist film after exposure, and coupled to an exposure apparatus; a dry treatment system having a dry treatment apparatus configured to perform in a dry mode a same kind of substrate treatment by the wet treatment apparatus; and a relay transfer system configured to transfer the substrate between the wet treatment system and the dry treatment system, wherein: when viewed from a coupling direction of the wet treatment system and the exposure apparatus, the wet treatment system is arranged such that the exposure apparatus projects from one side in a depth direction perpendicular to the coupling direction in top view; and the dry treatment system is arranged to be adjacent to the one side of the wet treatment system in the depth direction.

DETAILED DESCRIPTION

Figure 1:
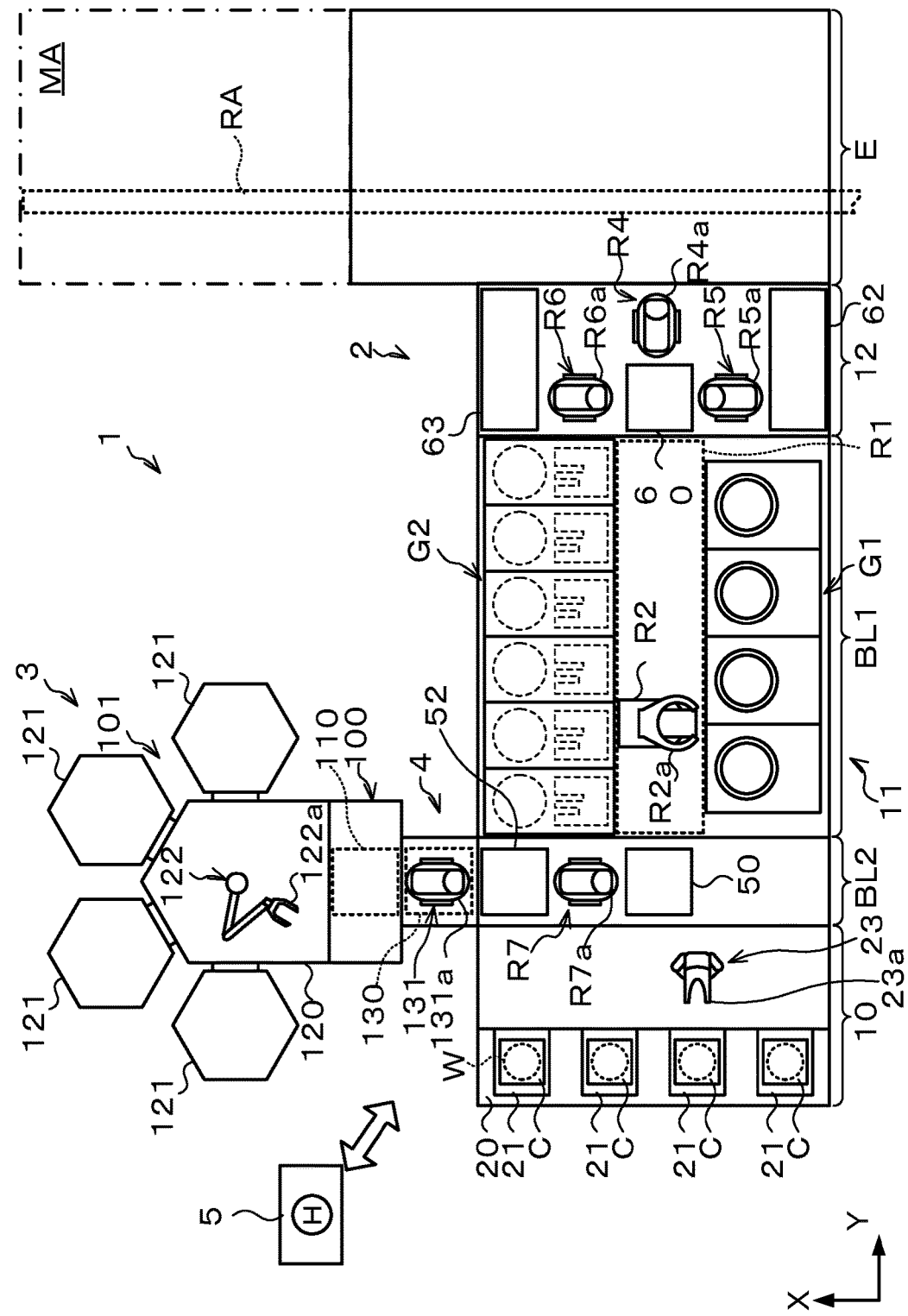
FIG. 1 is an explanatory view illustrating the outline of an internal configuration of a wafer treatment system as a substrate treatment system according to a first embodiment.

In the photolithography in a manufacturing process of a semiconductor device or the like, a series of treatments are performed in order to form a desired resist pattern on a substrate such as a semiconductor wafer (hereinafter, referred to as a "wafer"). The series of treatments include, for example, a resist film formation treatment of forming a resist film on the substrate, an exposure treatment of exposing the resist film, a developing treatment of developing the exposed resist film, and so on. The resist film formation treatment and the developing treatment of the treatments are performed in a coating and developing system having a substrate treatment apparatuses which perform the respective treatments, and the exposure treatment is performed in an exposure apparatus. The coating and developing system is used generally directly connected to the exposure apparatus. Further, in the coating and developing system, for example, the resist film formation treatment and the developing treatment are performed using liquid, namely, in a wet mode.

In the case where the exposure apparatus is larger in length in a direction perpendicular to a coupling direction of the coating and developing system and the exposure apparatus in top view, namely, depth than the wet coating and developing system which performs the developing treatment and so on in a wet mode, the exposure apparatus projects from a deep side surface of the wet coating and developing system when viewed from the coupling direction in some cases. Further, a region adjacent to a deep side surface of the exposure apparatus in the depth direction is a maintenance area where an apparatus for maintenance is arranged at the time of maintenance of the exposure apparatus.

Conventionally, in the case where the exposure apparatus is larger in depth as above, no apparatus or the like is arranged in a space adjacent to the deep side surface of the wet coating and developing system in the depth direction that is a space between the deep side surface of the wet coating and developing system and the deep side end of the maintenance area in view in the coupling direction, and therefore the space is wasted in some cases. In other words, the conventional substrate treatment system including a wet treatment system which performs treatments for photolithography other than the exposure treatment in a wet mode and is connected to the exposure apparatus has room for improvement in terms of productivity. Besides, also the substrate treatment system including a dry treatment system which performs treatments for photolithography other than the exposure treatment using gas, namely, in a dry mode and is connected to the exposure apparatus similarly has room for improvement in terms of productivity.

Hence, the technique according to this disclosure provides a substrate treatment system which includes a treatment system for performing treatments for photolithography other than an exposure treatment and is connected to an exposure apparatus, the system being high in productivity.

Hereinafter, a substrate treatment system and a substrate treatment method according to an embodiment will be explained with reference to the drawings. Note that, in the description and the drawings, components having substantially the same functional configurations are denoted by the same reference signs to omit duplicate explanations.

First Embodiment

<Coating and Developing Treatment System>

Figure 2:
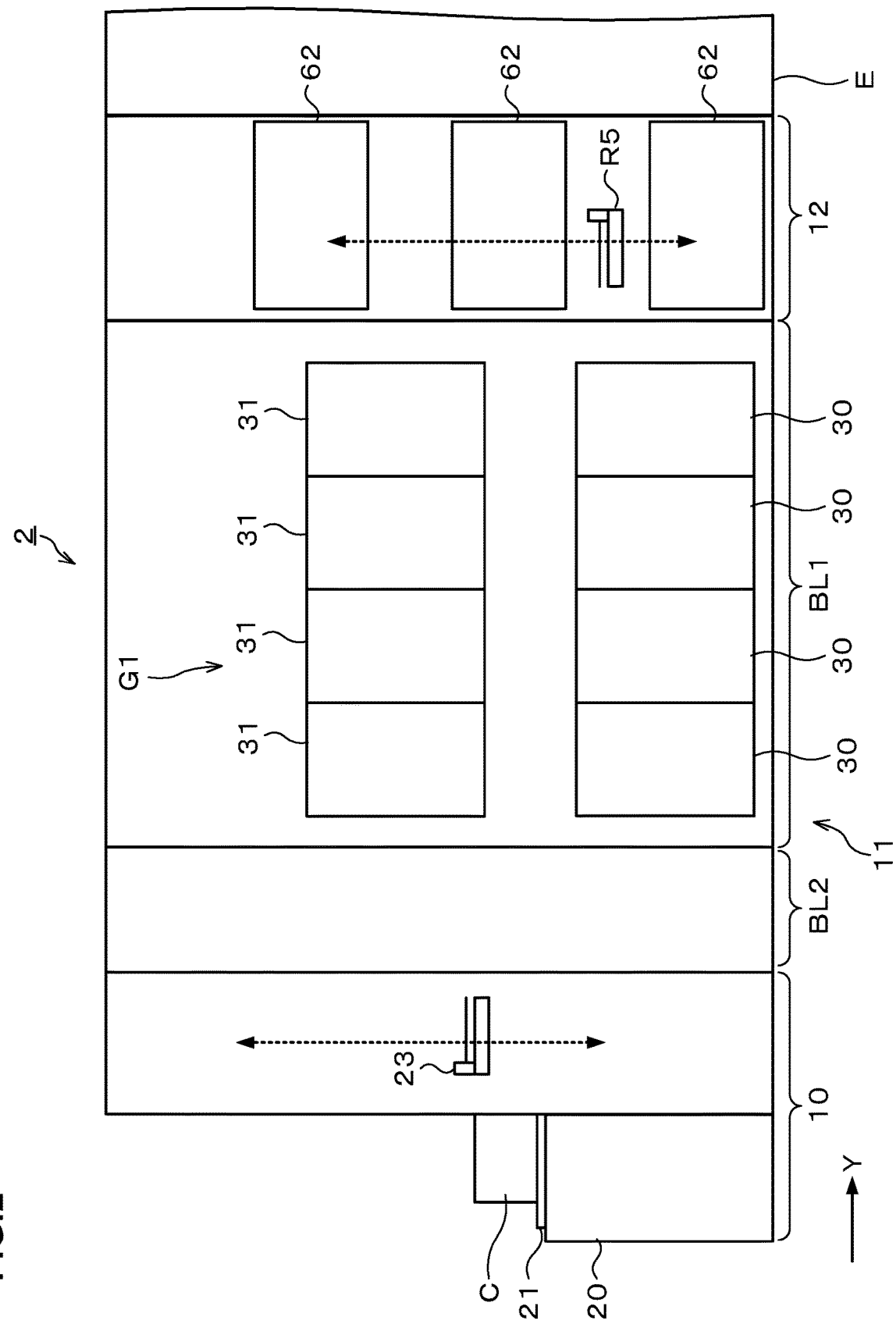
FIG. 2 is a view illustrating the outline of an internal configuration on the front side of a wet treatment system.
Figure 3:
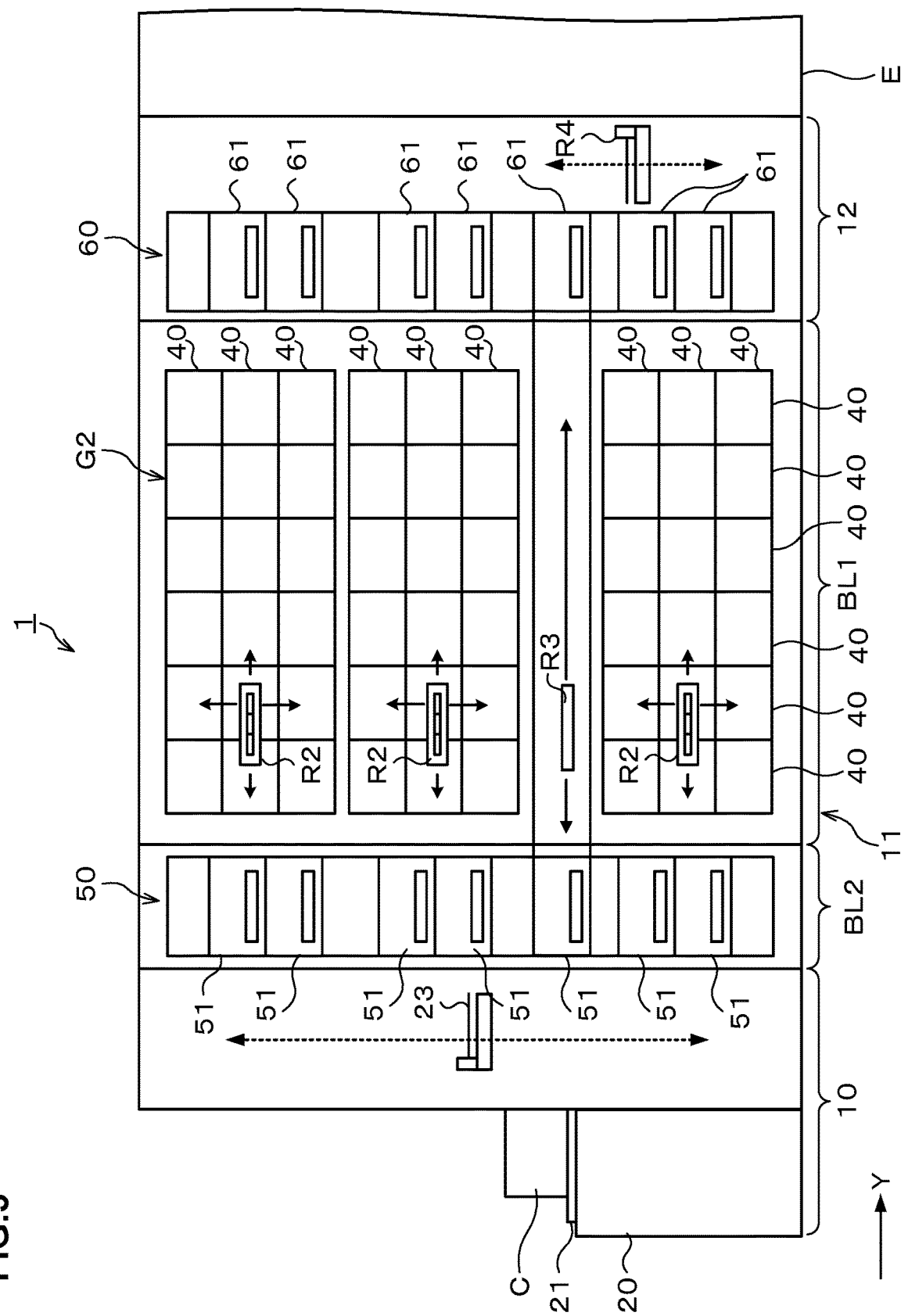
FIG. 3 is a view illustrating the outline of the internal configuration on the rear side of the wet treatment system.
Figure 4:
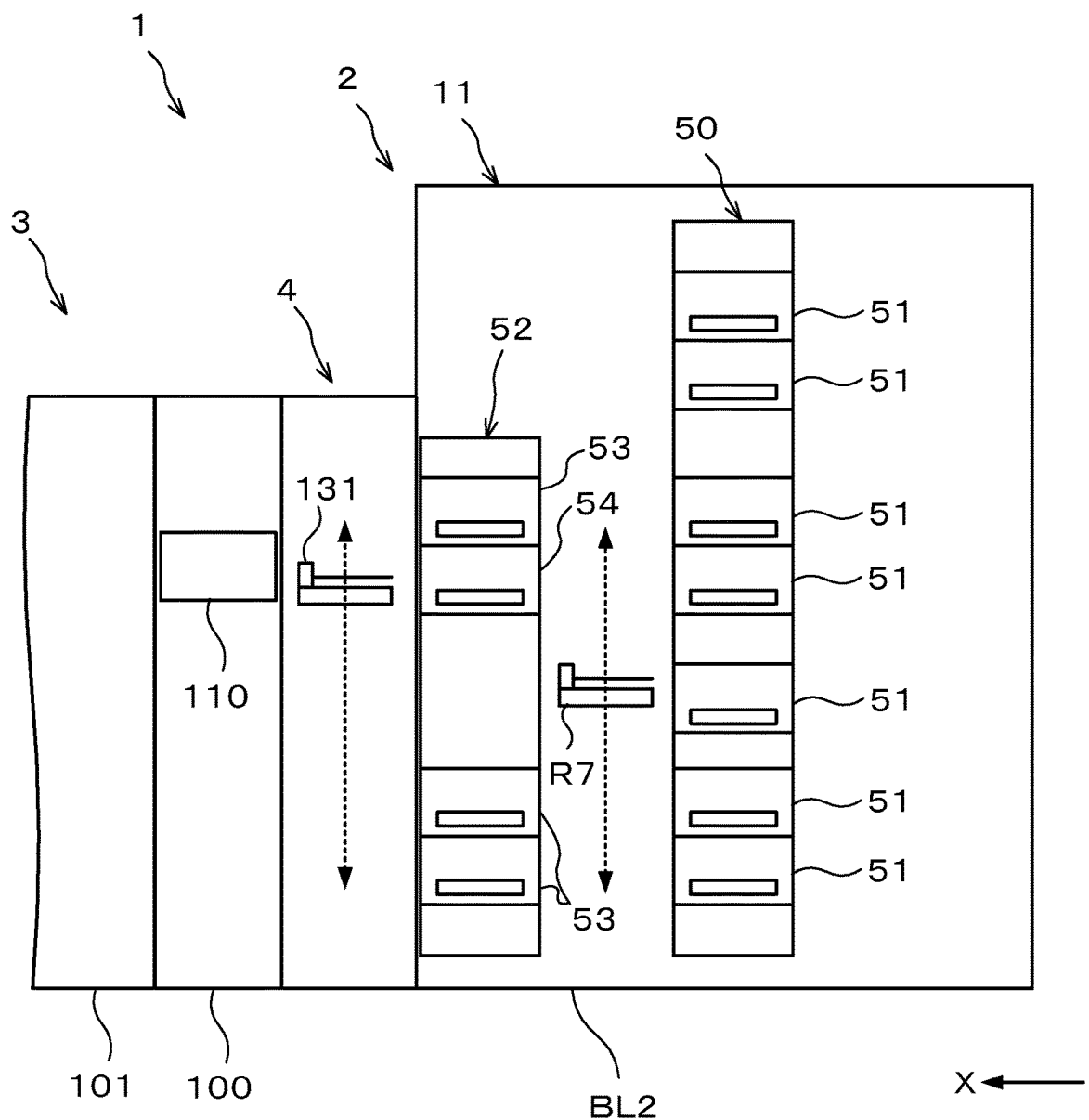
FIG. 4 is a view schematically illustrating a cross section of the wafer treatment system in FIG. 1 at a delivery block portion.

FIG. 1 is an explanatory view illustrating the outline of an internal configuration of a wafer treatment system as a substrate treatment system according to a first embodiment. FIG. 2 and FIG. 3 are views illustrating the outline of an internal configuration on the front side and the rear side of a later-explained wet treatment system, respectively. FIG. 4 is a view schematically illustrating a cross section of the wafer treatment system in FIG. 1 at a later-explained delivery block portion.

The wafer treatment system 1 in FIG. 1 includes a wet treatment system 2, a dry treatment system 3, and a relay transfer system 4.

The wet treatment system 2 includes, as illustrated in FIG. 1 to FIG. 3, a cassette station 10, a treatment station 11, and an interface station 12, and is coupled to an exposure apparatus E. The exposure apparatus E performs an exposure treatment on the wafer W as a substrate, specifically, performs the exposure treatment by an immersion method on the wafer W. In the wet treatment system 2, the cassette station 10, the treatment station 11, and the interface station 12 are integrally connected.

Note that a coupling direction of the wet treatment system 2 and the exposure apparatus E is called a width direction, and a direction perpendicular to the coupling direction, namely, the width direction in top view is called a depth direction in the following.

To/from the cassette station 10 of the wet treatment system 2, a cassette C that is a housing container configured to be able to house a plurality of wafers W is transferred in/out.

In the cassette station 10, a cassette stage 20 is provided, for example, at an end portion on a width direction one side (Y-direction negative side in FIG. 1 and so on). On the cassette stage 20, a plurality of, for example, four stage plates 21 are provided. The stage plates 21 are arranged side by side in a row in the depth direction (X-direction in FIG. 1). On the stage plates 21, the cassettes C can be mounted when the cassettes C are transferred in/out from/to the outside of the wet treatment system 2.

Further, in the cassette station 10, a transfer apparatus 23 which transfers the wafer W is provided, for example, at a width direction other side (Y-direction positive side in FIG. 1). The transfer apparatus 23 has a transfer arm 23a configured to be movable in the depth direction (X-direction in FIG. 1). Further, the transfer arm 23a of the transfer apparatus 23 is configured to be movable also in a vertical direction and a direction around a vertical axis. The transfer apparatus 23 can transfer the wafer W between the cassette C on each of the stage plates 21 and a delivery apparatus 51 in a later-explained delivery tower 50.

Note that in the cassette station 10, a storage section (not illustrated) where the cassette C is mounted and stored may be provided above the cassette stage 20 or at a portion farther away from the exposure apparatus E than the cassette stage 20 (Y-direction negative side portion in FIG. 1).

The treatment station 11 includes a plurality of various kinds of treatment apparatuses which perform predetermined treatments such as a resist film formation and so on.

The treatment station 11 is divided into a plurality of (two in the example in the drawing) blocks each including various apparatuses. A treatment block BL1 is provided on the interface station 12 side, and a delivery block BL2 is provided on the cassette station 10 side.

The treatment block BL1 has, for example, a first block G1 on the front side (X-direction negative side in FIG. 1) and has a second block G2 on the deep side (X-direction positive side in FIG. 1).

For example, in the first block G1, as illustrated in FIG. 2, a plurality of solution treatment apparatuses, for example, developing apparatuses 30 each of which performs a developing treatment on the wafer W and resist coating apparatuses 31 each of which applies a resist solution to the wafer W to form a resist film are arranged in this order from the bottom. The developing apparatus 30 is an example of a wet treatment apparatus. The wet treatment apparatus is an apparatus which performs in a wet mode a wafer treatment as any of substrate treatments from the resist film formation treatment on the wafer W to the developing treatment of the resist film after exposure, namely, any of wafer treatments for treatments for photolithography.

For example, the developing apparatus 30 and the resist coating apparatus 31 are arranged four each side by side in the width direction (Y-direction in FIG. 1). Note that the numbers and the arrangements of the developing apparatuses 30 and the resist coating apparatuses 31 can be arbitrarily selected.

In each of the developing apparatus 30 and the resist coating apparatus 31, a predetermined treatment solution is applied onto the wafer W, for example, by the spin coating method. In the spin coating method, the treatment solution is discharged onto the wafer W, for example, from a discharge nozzle and the wafer W is rotated to diffuse the treatment solution over the front surface of the wafer W.

For example, in the second block G2, as illustrated in FIG. 3, thermal treatment apparatuses 40 each of which performs a thermal treatment such as heating and cooling on the wafer W are arranged to line up in the vertical direction (up-down direction in the drawing) and the width direction (Y-direction in the drawing). The number and the arrangement of the thermal treatment apparatuses 40 can also be arbitrarily selected.

Further, in the treatment block BL1, as illustrated in FIG. 1, a transfer path R1 extending in the width direction is provided at a portion between the first block G1 and the second block G2. In the treatment block BL1, the plurality of developing apparatuses 30 and the plurality of resist coating apparatuses 31 are arranged in a manner to line up along the transfer path R1 extending in the width direction. In the transfer path R1, a transfer apparatus R2 for transferring the wafer W is arranged.

The transfer apparatus R2 has a transfer arm R2a movable, for example, in the width direction (Y-direction in FIG. 1), the vertical direction, and the direction around the vertical axis. The transfer apparatus R2 can move the transfer arm R2a holding the wafer W in a wafer transfer region D to transfer the wafer W to a predetermined apparatus in the first block G1, the second block G2, and predetermined apparatuses in the later-explained delivery tower 50 and delivery tower 60 located therearound. A plurality of the transfer apparatuses R2 are arranged, for example, one above the other as illustrated in FIG. 3, and can transfer the wafers W, for example, to predetermined apparatuses at similar heights in the first block G1, the second block G2, and the delivery towers 50, 60.

Further, in the transfer path R1, a shuttle transfer apparatus R3 is provided which linearly transfers the wafer W between the delivery tower 50 and the delivery tower 60.

The shuttle transfer apparatus R3 can linearly move the supported wafer W in the Y-direction to transfer the wafer W between the apparatus in the delivery tower 50 and the apparatus in the delivery tower 60 at similar heights.

In the delivery block BL2, as illustrated in FIG. 1, the delivery tower 50 is provided at the middle portion in the depth direction (X-direction in the drawing). Specifically, the delivery tower 50 is provided at a position, in the delivery block BL2, adjacent to the transfer path R1 of the treatment block BL1 in the width direction (Y-direction in the drawing). In the delivery tower 50, as illustrated in FIG. 3, a plurality of delivery apparatuses 51 are provided in a manner to be stacked in the vertical direction.

The interface station 12 is provided between the treatment station 11 and the exposure apparatus E as illustrated in FIG. 1, and delivers the wafer W between them.

At a position, in the interface station 12, adjacent to the transfer path R1 of the treatment block BL1 in the width direction (Y-direction in the drawing), the delivery tower 60 is provided. In the delivery tower 60, as illustrated in FIG. 3, a plurality of delivery apparatuses 61 are provided in a manner to be stacked in the vertical direction.

Further, as illustrated in FIG. 1, on the front side (X-direction negative side in the drawing) and the deep side (X-direction positive side in the drawing) in the interface station 12, a post-exposure cleaning apparatus 62 and a pre-exposure cleaning apparatus 63 are provided, respectively. The post-exposure cleaning apparatus 62 cleans the wafer W after the exposure by the exposure apparatus E. The pre-exposure cleaning apparatus 63 cleans the wafer W on which the resist film has been formed, specifically, the rear surface of the wafer W before the exposure by the exposure apparatus E. For example, as illustrated in FIG. 2, a plurality of (three in the example in the drawing) post-exposure cleaning apparatuses 62 are arranged to line up in the vertical direction (up-down direction in the drawing) on the front side in the interface station 12. Though not illustrated, a plurality of the pre-exposure cleaning apparatuses 63 are arranged, as with the post-exposure cleaning apparatuses 62, on the deep side in the interface station 12. The numbers and the arrangements of the post-exposure cleaning apparatuses 62 and the pre-exposure cleaning apparatuses 63 can also be arbitrarily selected.

Further, as illustrated in FIG. 1, transfer apparatuses R4 to R6 are provided in the interface station 12.

The transfer apparatus R4 is provided at a position adjacent to the delivery tower 60 in the width direction (Y-direction in the drawing), and has a transfer arm R4a which is movable, for example, in the depth direction (X-direction in FIG. 1), the vertical direction, and the direction around the vertical axis. The transfer apparatus R4 can transfer the wafer W between the plurality of delivery apparatuses 61 in the delivery tower 60 and the exposure apparatus E while holding the wafer W by the transfer arm R4a.

The transfer apparatus R5 is provided between the delivery tower 60 and the post-exposure cleaning apparatus 62, and has a transfer arm R5a which is movable, for example, in the vertical direction and the direction around the vertical axis. The transfer apparatus R5 can transfer the wafer W between the plurality of delivery apparatuses 61 in the delivery tower 60 and the plurality of post-exposure cleaning apparatuses 62 while holding the wafer W by the transfer arm R5a.

The transfer apparatus R6 is provided between the delivery tower 60 and the pre-exposure cleaning apparatus 63, and has a transfer arm R6a which is movable, for example, in the vertical direction and the direction around the vertical axis. The transfer apparatus R6 can transfer the wafer W between the plurality of delivery apparatuses 61 in the delivery tower 60 and the plurality of pre-exposure cleaning apparatuses 63 while holding the wafer W by the transfer arm R6a.

The delivery block BL2 of the treatment station 11 further has, as illustrated in FIG. 1, a delivery tower 52 at an end portion on the deep side (X-direction positive side in the drawing).

The delivery tower 52 has a delivery apparatus 53 as illustrated in FIG. 4. In the delivery tower 52, a plurality of the delivery apparatuses 53 may be provided in a manner to be staked in the vertical direction (up-down direction in FIG. 4).

Further, the delivery tower 52 may have a cooling apparatus 54 which cools the wafer.

Furthermore, in the delivery block BL2, a transfer apparatus R7 is provided as illustrated in FIG. 1. The transfer apparatus R7 is provided between the delivery tower 50 and the delivery tower 52, and has a transfer arm R7a which is movable, for example, in the vertical direction and the direction around the vertical axis. The transfer apparatus R7 can transfer the wafer W between the plurality of delivery apparatuses 51 in the delivery tower 50 and the plurality of delivery apparatuses 53 and the cooling apparatus 54 in the delivery tower 52 while holding the wafer W by the transfer arm R7a.

The dry treatment system 3 has, as illustrated in FIG. 1, a load lock station 100 and a treatment station 101. In the dry treatment system 3, the load lock station 100 and the treatment station 101 are integrally connected. In this example, a coupling direction of the load lock station 100 and the treatment station 101 and the coupling direction of the wet treatment system 2 and the exposure apparatus E are perpendicular to each other in top view.

In the load lock station 100, a load lock apparatus 110 is provided which is configured such that the atmosphere therein can be switched between a reduced-pressure atmosphere and an atmospheric-pressure atmosphere.

The treatment station 101 has a vacuum transfer chamber 120 and a treatment apparatus 121.

The vacuum transfer chamber 120 is composed of a housing configured to be sealable, and its inside is kept in a reduced-pressure state (vacuum state). The vacuum transfer chamber 120 is formed, for example, in an almost polygonal shape (pentagon in the example in the drawing) in top view.

A plurality of (four in the example in the drawing) treatment apparatuses 121 are provided, for example, in the treatment station 101. At least one of the treatment apparatuses 121 provided in the treatment station 101 is a dry treatment apparatus, and performs in a dry mode the same kind of wafer treatment as the wet treatment apparatus in the wet treatment system 2, specifically, performs in a dry mode the developing treatment performed by the developing apparatus 30 in the wet treatment system 2. The dry mode is a mode using gas, specifically, a mode using gas under a reduced pressure. It can also be said that the dry treatment is intended to obtain an action that is the purpose of the treatment mainly with gas, and the wet treatment is intended to obtain the action mainly with liquid.

In the treatment station 101, the plurality of treatment apparatuses 121 and the load lock station 100 are arranged outside the vacuum transfer chamber 120, for example, in a manner to surround the vacuum transfer chamber 120 in top view, namely, in a manner to be arranged side by side around the vertical axis passing through the center portion of the vacuum transfer chamber 120.

Further, inside the vacuum transfer chamber 120, a transfer apparatus 122 which transfers the wafer W is provided. The transfer apparatus 122 has a transfer arm 122a movable, for example, in the direction around the vertical axis. The transfer apparatus 122 can transfer the wafer W between the plurality of treatment apparatuses 121 and the load lock apparatus 110 while holding the wafer W by the transfer arm 122a.

The relay transfer system 4 transfers the wafer W between the wet treatment system 2 and the dry treatment system 3, specifically, transfers the wafer W in units of a wafer, namely, in a single wafer manner.

The relay transfer system 4 is provided with a transfer path 130, and transfers the wafer W between the wet treatment system 2 and the dry treatment system 3 via the transfer path 130. The transfer path 130 of the relay transfer system 4 constitutes a transfer route extending in the depth direction (X-direction in the drawing) including the delivery tower 50 and so on in the delivery block BL2. The transfer route is perpendicular, in top view, to the transfer route extending in the width direction (Y-direction in the drawing) including the transfer path R1 of the treatment block BL1.

In this embodiment, the relay transfer system 4 is connected to a portion, of the wet treatment system 2, farther away from the exposure apparatus E than the treatment block BL1, specifically, connected to the delivery block BL2. More specifically, the relay transfer system 4 has the transfer path 130 connected to the delivery block BL2.

In the transfer path 130, a transfer apparatus 131 which transfers the wafer W is arranged.

The transfer apparatus 131 has a transfer arm 131a movable, for example, in the vertical direction and the direction around the vertical axis. The transfer apparatus 131 can transfer the wafer W between the plurality of delivery apparatuses 53 and the cooling apparatus 54 in the delivery tower 52 and the load lock apparatus 110 while holding the wafer W by the transfer arm 131a.

Further, the wafer treatment system 1 has a controller 5 which performs control of the wafer treatment system 1 including control of the transfer apparatuses. The controller 5 is a computer including, for example, a processor such as a CPU, a memory and so on, and has a program storage (not illustrated). In the program storage, a program for controlling a later-explained wafer treatment by controlling drive systems of the operations of the above various treatment apparatuses, various transfer apparatuses and so on is stored. Note that the above program may be the one recorded in a computer-readable storage medium H and installed from the storage medium H into the controller 5. The storage medium H may be a transitory one or a non-transitory one.

Incidentally, when the exposure apparatus E is, for example, for liquid-immersion exposure, the exposure apparatus E is larger in length in the depth direction (X-direction in the drawing), namely, depth than the wet treatment system 2 in some cases. In the case where the exposure apparatus E is larger in depth as above, the wet treatment system 2 is arranged such that the exposure apparatus E projects to the deep side from the deep side (X-direction positive side in the drawing) of the wet treatment system 2. The wet treatment system 2 is similarly arranged also in the wafer treatment system 1. Further, in the wafer treatment system 1, the dry treatment system 3 is arranged adjacent to the deep side (X-direction positive side in the drawing) of the wet treatment system 2 in the depth direction. Specifically, in the wafer treatment system 1, the dry treatment system 3 is adjacent to the deep side of the wet treatment system 2 in the depth direction with a work aisle to be used for maintenance time and the like of the various apparatuses intervening therebetween.

Note that in the exposure apparatus E, a maintenance area MA for the exposure apparatus E is set on the deep side (X-direction positive side in the drawing) of the exposure apparatus E.

Specifically, the dry treatment system 3 is arranged such that its deep side (X-direction positive side in the drawing) end is located closer to the front side (X-direction negative side in the drawing) than a deep side (X-direction positive side in the drawing) end of the maintenance area MA for the exposure apparatus E. More specifically, a maintenance area for the dry treatment system 3 is set also on the deep side of the dry treatment system 3, and therefore the dry treatment system 3 is arranged such that the deep side end of the maintenance area for the dry treatment system 3 is located closer to the front side than the deep side end of the maintenance area for the exposure apparatus E.

The deep side (X-direction positive side in the drawing) end of the maintenance area MA for the exposure apparatus E is set, for example, based on a deep side (X-direction positive side in the drawing) end of a rail RA for a crane to be used for the maintenance of the exposure apparatus E, more specifically, coincides with the deep side end of the rail RA. The rail RA is permanently installed, for example, in a factory where the wafer treatment system 1 is installed.

Example 1 of the Wafer Treatment

Next, one example of the wafer treatment using the wafer treatment system 1 will be explained.

In the wafer treatment using the wafer treatment system 1, the wafer W is selectively transferred to one of the developing apparatus 30 which performs a wet developing treatment and the treatment apparatus 121 which performs a dry developing treatment.

In this example, the number of times of the developing treatment performed on one wafer W is one, and only either one of the wet developing treatment and the dry developing treatment is performed. Specifically, the wafer W is transferred only to one of the developing apparatus 30 which performs the wet developing treatment and the treatment apparatus 121 which performs the dry developing treatment.

In the case of performing only the wet developing treatment, the dry treatment system 3 of the wafer treatment system 1 is not used, but only the wet treatment system 2 is used. On the other hand, in the case of performing only the dry developing treatment, for example, the treatments before the developing treatment of treatments for photolithography (excluding the exposure treatment) are performed in the wet treatment system 2, and then the wafer W is transferred to the dry treatment system 3 through the transfer by the relay transfer system 4, and subjected to the dry developing treatment.

Hereinafter, the wafer treatment will be explained more specifically.

In the case of performing one of the wet and dry developing treatments, in the wafer treatment using the wafer treatment system 1, the wafer W is first taken out of the cassette C on the cassette stage 20 by the transfer apparatus 23 in the wet treatment system 2 and transferred to the delivery apparatus 51 in the delivery tower 50 in the delivery block BL2.

Next, the wafer W is transferred by the transfer apparatus R2 to the thermal treatment apparatus 40 in the treatment block BL1 and subjected to a temperature regulation treatment. The wafer W is then transferred to the resist coating apparatus 31 in which a resist film is formed on the wafer W. Then, the wafer W is transferred to the thermal treatment apparatus 40 and subjected to a pre-bake (PAB: Pre-Applied Bake) treatment. Note that similar thermal treatments are performed in the pre-bake treatment, and subsequent PEB (Post Exposure Bake) treatment and post-bake treatment. However, the thermal treatment apparatuses 40 used for the thermal treatments are different from one another.

Next, the wafer W is transferred to the delivery apparatus 61 in the delivery tower 60 in the interface station 12. Subsequently, the wafer W is transferred by the transfer apparatus R6 to the pre-exposure cleaning apparatus 63 in which the rear surface of the wafer W is cleaned. Thereafter, the wafer W is transferred to the delivery apparatus 61 in the delivery tower 60. Then, the wafer W is transferred by the transfer apparatus R4 to the exposure apparatus E and subjected to liquid-immersion exposure.

After the liquid-immersion exposure, the wafer W is transferred by the transfer apparatus R4 to the delivery apparatus 61 in the delivery tower 60. Then, the wafer W is transferred by the transfer apparatus R5 to the post-exposure cleaning apparatus 62 and cleaned. Thereafter, the wafer W is transferred to the delivery apparatus 61 in the delivery tower 60.

Subsequently, the wafer W is transferred by the transfer apparatus R2 to the thermal treatment apparatus 40 and subjected to the PEB treatment.

Thereafter, either the wet developing treatment or the dry developing treatment is performed on the wafer W.

In the case where the wet developing treatment is performed, the wafer W after the PEB treatment is transferred by the transfer apparatus R2 to the developing apparatus 30. After the wet developing treatment is performed by the developing apparatus 30, the wafer W is transferred to the thermal treatment apparatus 40 and subjected to the post-bake treatment. Thereafter, the wafer W is transferred to the delivery apparatus 51 in the delivery tower 50 in the delivery block BL2. Then, the wafer W is returned by the transfer apparatus 23 to the cassette C on the cassette stage 20.

On the other hand, in the case where the dry developing treatment is performed, the wafer W after the PEB treatment is transferred by the transfer apparatus R2 to the delivery apparatus 51 in the delivery tower 50 in the delivery block BL2. Then, the wafer W is transferred by the transfer apparatus R7 to the delivery apparatus 53 in the delivery tower 52. Subsequently, the wafer W is transferred by the transfer apparatus 131 in the relay transfer system 4 via the transfer path 130 to the load lock apparatus 110 in the dry treatment system 3. Subsequently, after the inside of the load lock apparatus 110 is reduced in pressure, the wafer W is transferred by the transfer apparatus 122 to a predetermined treatment apparatus 121 and subjected to the dry developing treatment. Thereafter, the wafer W is returned to the load lock apparatus 110. Then, after the inside of the load lock apparatus 110 is returned to the atmospheric-pressure atmosphere, the wafer W is transferred by the transfer apparatus 131 in the relay transfer system 4 via the transfer path 130 to the cooling apparatus 54 in the delivery tower 52 in the delivery block BL2, and cooled to almost room temperature. Thereafter, the wafer W is transferred by the transfer apparatus R7 to the delivery apparatus 51 in the delivery tower in the delivery block BL2. Then, the wafer W is returned by the transfer apparatus 23 to the cassette C on the cassette stage 20.

Example 2 of the Wafer Treatment

In above Example 1 of the wafer treatment, the number of times of the developing treatment performed on the wafer W is one, and either one of the wet developing treatment and the dry developing treatment is performed on the wafer W. The number of times of the developing treatment performed on the wafer W in the wafer treatment using the wafer treatment system 1 may be plural, in which case both of the wet developing treatment and the dry developing treatment may be performed on the wafer W.

For example, in the case where the number of times of the developing treatment is two, the wet developing treatment may be performed for the first time and the dry developing treatment may be performed for the second time, or vice versa. Further, in this case, a thermal treatment may be performed at least either one of before the developing treatment for the first time, between the developing treatment for the first time and the developing treatment for the second time (namely, between the wet developing treatment and the dry developing treatment), and after the developing treatment for the second time.

Specifically, in the wafer treatment system 1, the wafer W may be transferred to the apparatus for the development for the first time and subjected to either one of the dry and wet developing treatments, and then transferred via the transfer path 130 of the relay transfer system 4 to the apparatus for the development for the second time and subjected to either the other of the dry and wet developing treatments. In this case, a thermal treatment may be performed in the thermal treatment apparatus 40 in the wet treatment system 2 at least either one of before the developing treatment for the first time, between the wet developing treatment and the dry developing treatment, and after the developing treatment for the second time. Whether the thermal treatment is performed or not can be selected according to the purpose.

Main Effects of this Embodiment

In the wafer treatment system 1, as explained above, the wet treatment system 2 is arranged such that the exposure apparatus E projects to the deep side from the deep side (X-direction positive side in FIG. 1) of the wet treatment system 2. Conventionally, in the case where the wet treatment system 2 is arranged in this state, no apparatus or the like is arranged in a space adjacent to the deep side surface of the wet treatment system 2 in the depth direction that is a space between the deep side surface of the wet treatment system 2 and the deep side end of the maintenance area MA for the exposure apparatus in view in the width direction (Y-direction in FIG. 1), and therefore the space is wasted. In contrast, in this embodiment, the dry treatment system 3 is arranged in the space. Further, the relay transfer system 4 which transfers the wafer W between the dry treatment system 3 and the wet treatment system 2 is provided to make it possible that the wet and dry treatments for photolithography (specifically, developing treatments) are selectively or successively performed. The wafer treatment system 1 effectively uses the space which is conventionally wasted as above to enable the wet and dry treatments for photolithography to be selectively or successively performed, and is thus high in productivity. In short, according to this embodiment, it is possible to provide the wafer treatment system 1 which includes the wet treatment system 2 and is connected to the exposure apparatus E, the system being high in productivity.

Further, in this embodiment, the wafer W is treated inline both in the case of performing the wet treatments for photolithography and in the case of performing the dry treatments for photolithography, as a series of treatments for forming a resist pattern including the exposure treatment. Specifically, the wafer W is not transferred out to the outside the wafer treatment system 1 until the wafer W is taken out of the inside the cassette C transferred into the wafer treatment system 1, subjected to the series of treatments, and then returned into the cassette C for the transfer to the outside of the wafer treatment system 1. In order to enable the inline treatments, the controller 5 manages transfer start timing for the wafer W for the series of treatments, completion timing of each of the series of treatments, and timing to return the wafer W to the cassette C. Therefore, the controller 5 can easily grasp the status of each of the series of treatments and adjust the transfer timing even when the series of treatments include any of the wet treatments for photolithography and the dry treatments for photolithography.

Further, in this embodiment, a plurality of developing apparatuses 30 each of which performs the wet developing treatment are arranged in a manner to line up along the transfer path R1 extending in the width direction (Y-direction in FIG. 1) in the wet treatment system 2, and the wafer W is transferred between the wet treatment system 2 and the dry treatment system 3 via the transfer route extending in the depth direction (X-direction in FIG. 1) including the transfer path 130 of the relay transfer system 4. In other words, in this embodiment, the developing apparatuses 30 each of which performs the wet developing treatment are lined up along the transfer path R1 toward the exposure apparatus E, and the wafer W is transferred in a direction at right angles to the transfer path R1 from the transfer path R1 in the case of performing the dry developing treatment. Therefore, the transfer route for the wafer W is simple both in performing the wet developing treatment and in performing the dry developing treatment, thus leading to high transfer efficiency.

Furthermore, in this embodiment, the transfer path 130 of the relay transfer system 4 has one end connected to the dry treatment system 3 and the other end not directly connected to the exposure apparatus E but connected to the exposure apparatus E via the wet treatment system 2 that is generally set to be positive in pressure with respect to the exposure apparatus E. In other words, the dry treatment system 3 and the exposure apparatus E are connected to each other via the wet treatment system 2 that is positive in pressure with respect to the exposure apparatus E. There is a case where a corrosive gas is sometimes used for the dry developing treatment and so on in the dry treatment system 3, so that the connection of the dry treatment system 3 and the exposure apparatus E as above can suppress entrance of the corrosive gas into the exposure apparatus E.

Another Example of the Dry Treatment System

Figure 5:
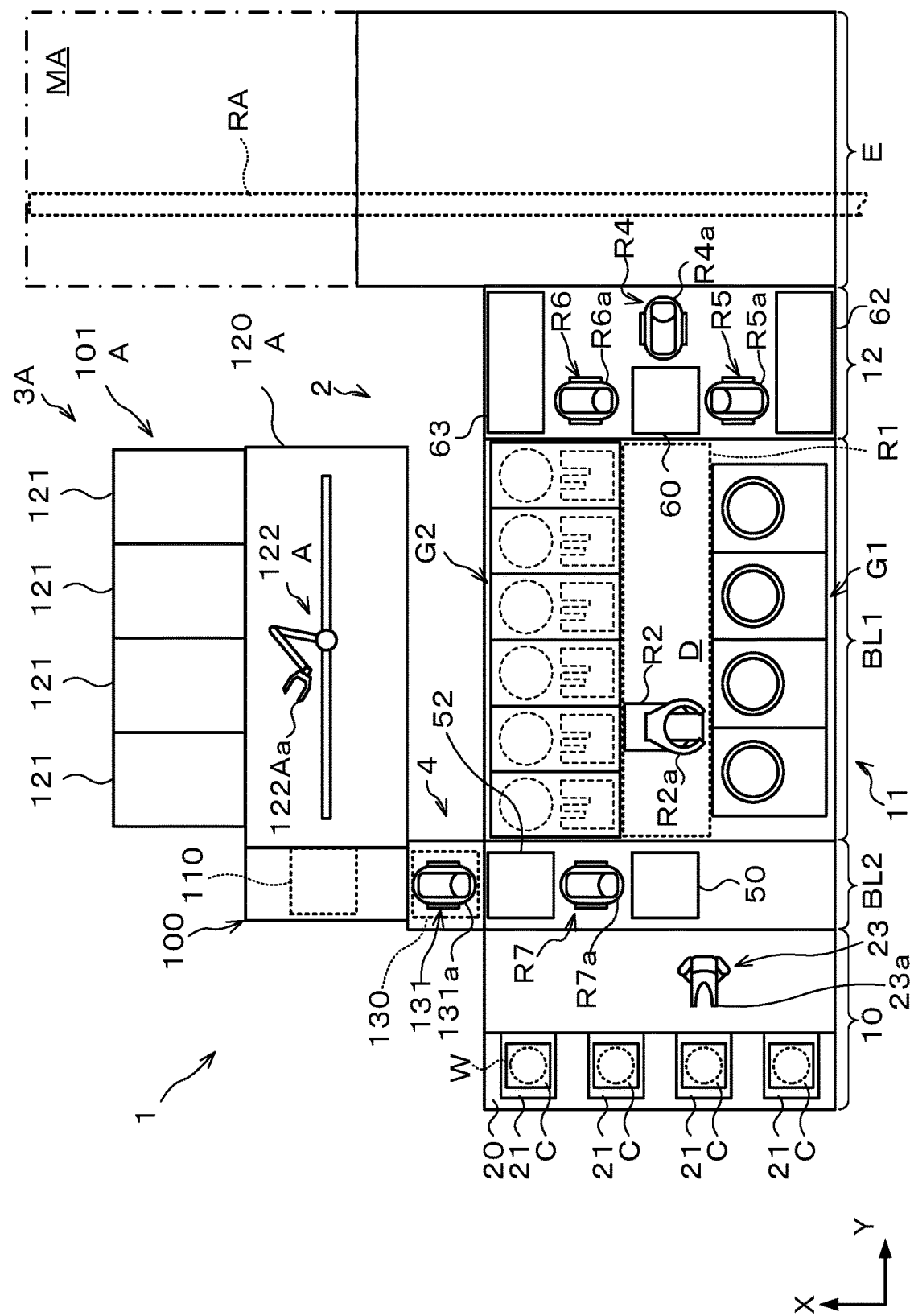
FIG. 5 is a view illustrating another example of a dry treatment system.

FIG. 5 is a view illustrating another example of the dry treatment system.

The configuration of the dry treatment system is not limited to the example illustrated in FIG. 1 and so on. For example, as in a dry treatment system 3A in FIG. 5, a vacuum transfer chamber 120A may be formed in a rectangular shape in top view long in a coupling direction of the load lock station 100 and a treatment station 101A. In this case and so on, the plurality of treatment apparatuses 121 may be arranged in a manner to line up along the coupling direction. In this case, a transfer arm 122Aa of a transfer apparatus 122 is configured to be movable, for example, in the coupling direction and the direction around the vertical axis.

Further, the coupling direction of the load lock station 100 and the treatment station 101A and the coupling direction of the wet treatment system 2 and the exposure apparatus E may be parallel in top view. This also applies to the dry treatment system 3 illustrated in FIG. 1 and so on.

Though the cooling apparatus which cools the wafer W after the dry developing treatment is provided in the wet treatment system 2 in the above example, the cooling apparatus may be provided in the dry treatment system. In the case where the cooling apparatus is provided in the dry treatment system, the cooling apparatus is arranged to be connected, for example, to the load lock apparatus 110.

Besides, the PEB treatment is performed in the wet treatment system 2 in the above example, but may be performed in the dry treatment system. In this case, the PEB treatment may be performed in the treatment apparatus 121 or may be performed in a heating apparatus provided separately from the treatment apparatus 121.

Further, in the case of using the corrosive gas for the dry developing treatment, a heating apparatus which removes the corrosive gas adhering to the wafer W during the dry developing treatment by heating may be provided in the dry treatment system. This kind of heating apparatus can be provided in the wet treatment system 2, but is provided in the dry treatment system to be able to prevent the wet treatment system 2 from being damaged by the corrosive gas.

Figure 6:
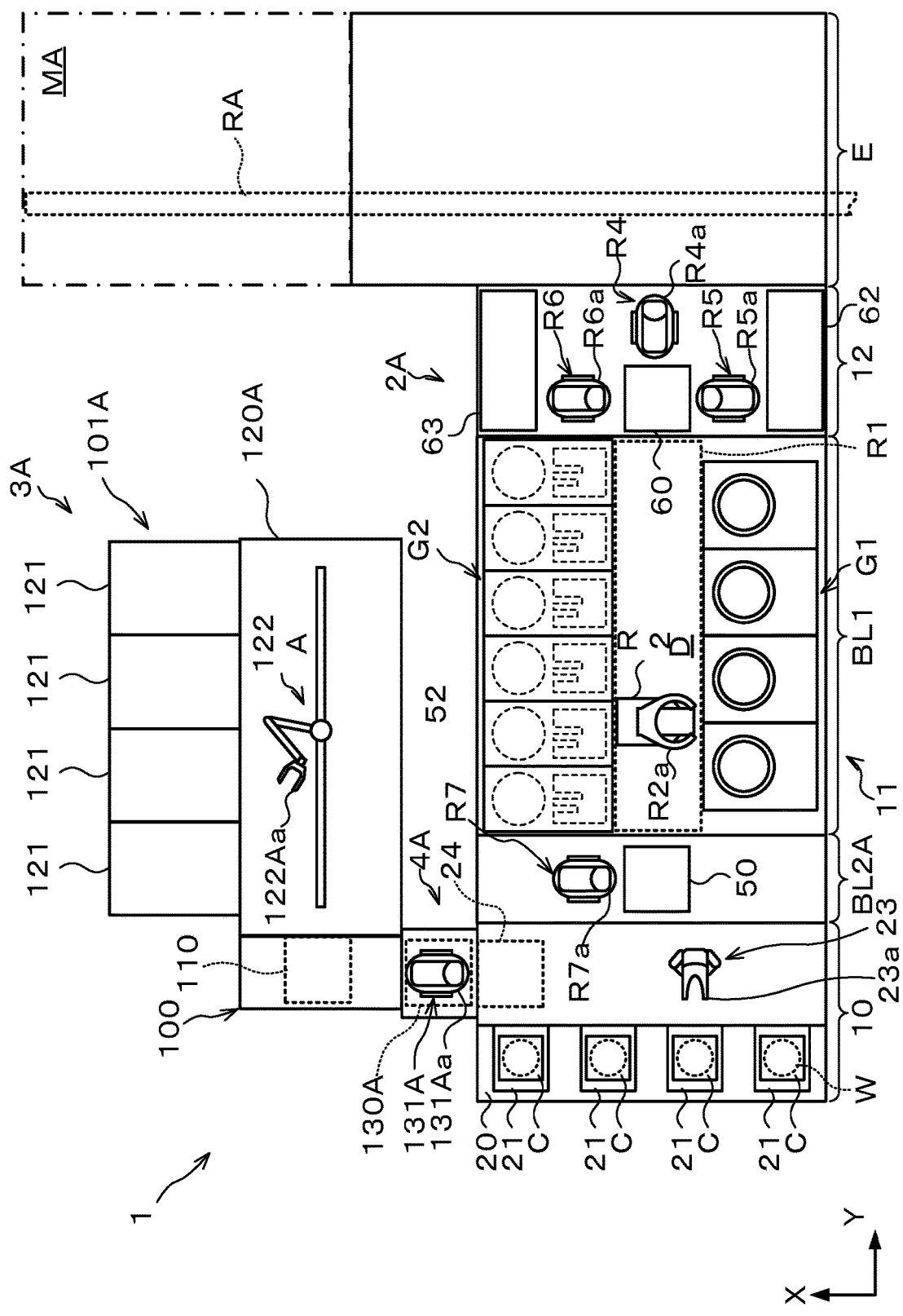
FIG. 6 is a view illustrating another example of a connecting portion of a relay transfer system to the wet treatment system.
Figure 7:
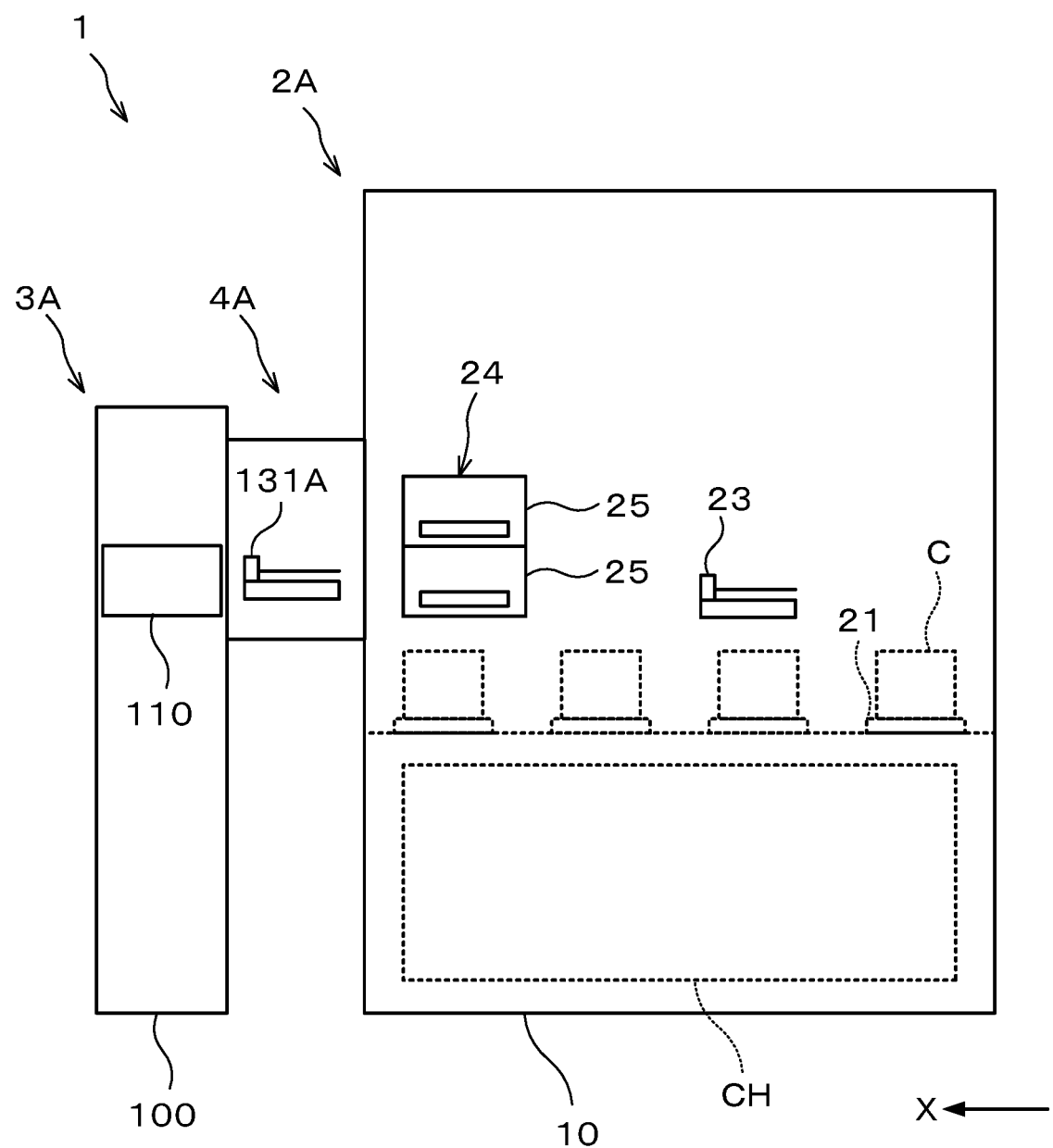
FIG. 7 is a view illustrating another example of the connecting portion of the relay transfer system to the wet treatment system.

Another Example 1 of a Connecting Portion of the Relay Transfer System to the Wet Treatment System FIG. 6 and FIG. 7 are views illustrating another example of a connecting portion of the relay transfer system to the wet treatment system.

In the above example, the relay transfer system 4 is connected to the portion, of the wet treatment system 2, farther away from the exposure apparatus E than the treatment block BL1, the portion being the delivery block BL2. In contrast, a connecting portion of a relay transfer system 4A to a wet treatment system 2A is a portion farther away from the exposure apparatus E than the treatment block BL1, the portion being not the delivery block BL2 but the cassette station 10 in the example in FIG. 6 and FIG. 7. Specifically, a connecting portion of a transfer path 130A of the relay transfer system 4A to the wet treatment system 2A is a portion on the treatment station 11 side (Y-direction positive side in FIG. 6) of the cassette station 10.

In this example, the delivery tower 52 (see FIG. 1) is omitted from a delivery block BL2A and, instead, a delivery box 24 is provided on the treatment station 11 side in the cassette station 10 and at an end portion on the deep side (X-direction positive side in FIG. 6). The delivery box 24 has a plurality of delivery apparatuses 25 as illustrated, for example, in FIG. 7. The delivery box 24 may have a cooling apparatus. Further, in this example, the transfer apparatus 23 in the cassette station 10 can also transfer the wafer W to the delivery apparatus 25.

Further, in this example, a transfer apparatus 131A arranged in the transfer path 130A of the relay transfer system 4A can transfer the wafer W between the delivery apparatuses 25 in the delivery box 24 and the load lock apparatus 110 while holding the wafer W by a transfer arm 131Aa.

Note that a lower portion of the cassette station 10 is a chemical chamber CH which houses a liquid bottle storing a treatment solution to be used in the treatment block BL1 and so on. In this example, the relay transfer system 4A may be arranged at a position higher than the chemical chamber CH. This can prevent the work by the worker for the chemical chamber CH such as replacement of the above liquid bottle from being hindered by the relay transfer system 4A.

Another Example of the Wet Treatment System

Figure 8:
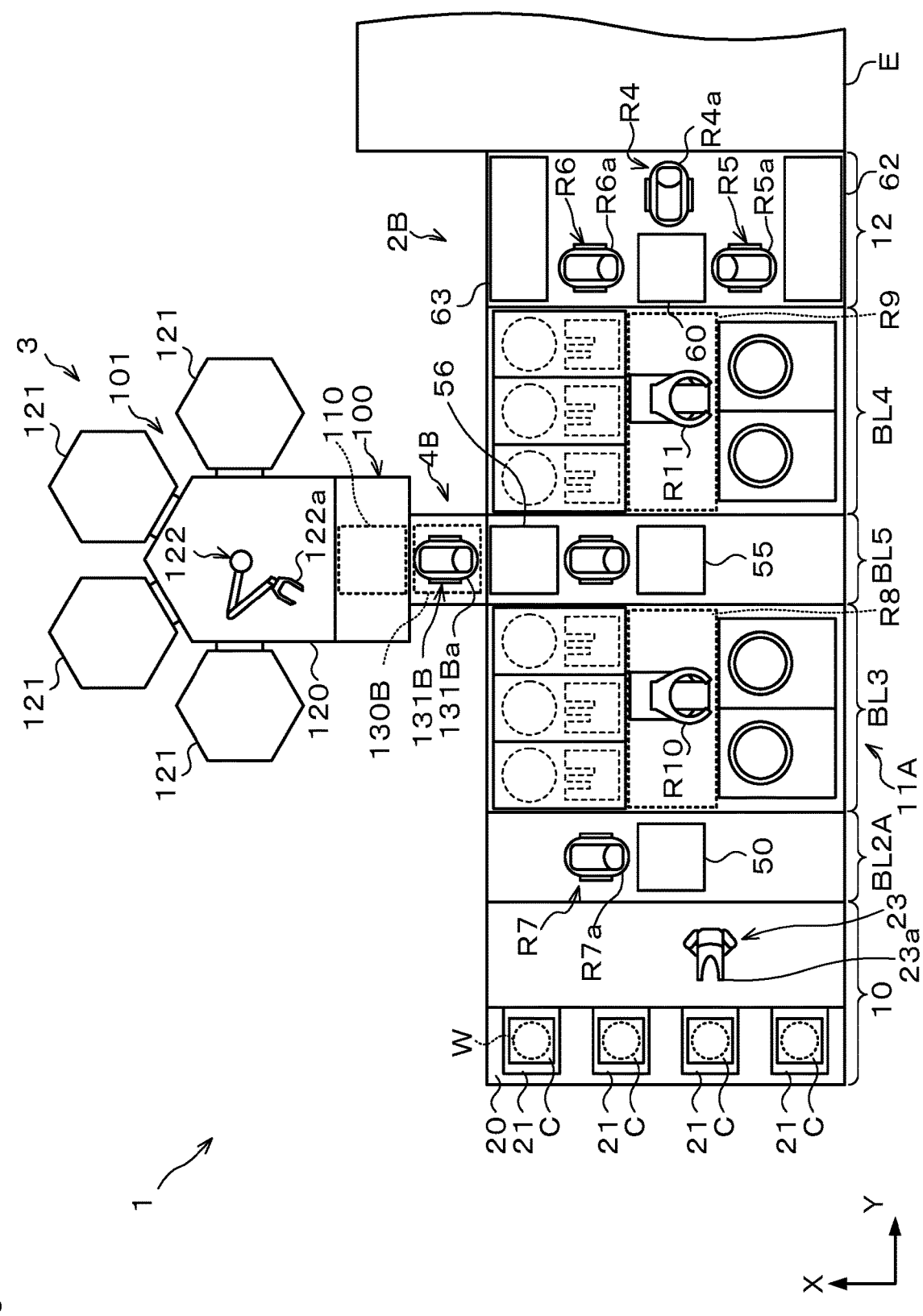
FIG. 8 is a view illustrating another example of the wet treatment system.

FIG. 8 is a view illustrating another example of the wet treatment system.

In the above example, the number of the treatment blocks BL1 in the treatment station 11 in the wet treatment system 2, 2A is one. In contrast, in a wet treatment system 2B in FIG. 8, two treatment blocks BL3, BL4 are provided along the width direction (Y-direction in the drawing) in order from the cassette station 10 side in a treatment station 11A.

Each of the treatment blocks BL3, BL4 is configured roughly similarly to the treatment block BL1 illustrated in FIG. 1 and so on. Specifically, in each of the treatment blocks BL3, BL4, a plurality of (for example, two) developing apparatuses 30 and a plurality of (for example, two) resist coating apparatuses 31 are arranged, for example, on the front side (X-direction negative side in FIG. 8) side by side along the width direction (Y-direction in the drawing). Further, in each of the treatment blocks BL3, BL4, a plurality of thermal treatment apparatuses 40 are arranged, for example, on the deep side (Y-direction positive side in FIG. 8), side by side along the vertical direction and the width direction (Y-direction in the drawing).

Note that the numbers of the developing apparatuses 30 lined up in the width direction may be the same and different from each other between the treatment block BL3 and the treatment block BL4. This also applies to the resist coating apparatuses 31 and the thermal treatment apparatus 40.

Further, in the treatment blocks BL3, BL4, transfer paths R8, R9 extending in the width direction are provided at portions each between a portion where the solution treatment apparatuses such as the developing apparatuses 30 and so on are provided and a portion where the thermal treatment apparatuses are provided. In the treatment blocks BL3, BL4, a plurality of the developing apparatuses 30 and a plurality of the resist coating apparatuses 31 are arranged so as to line up along the transfer paths R8, R9 extending in the width direction. In the transfer paths R8, R9, transfer apparatuses R10, R11 each of which transfers the wafer W are arranged, respectively.

The transfer apparatus R10 can transfer the wafer W to the solution treatment apparatuses, the thermal treatment apparatuses 40, the delivery apparatuses 51 in the delivery tower 50, and delivery apparatuses in a later-explained delivery tower 55 therearound. The transfer apparatus R11 can transfer the wafer W to the solution treatment apparatuses, the thermal treatment apparatuses 40, the delivery apparatuses in the later-explained delivery tower 55, and the delivery apparatuses 61 in the delivery tower 60 therearound.

Further, the treatment station 11A has a relay block BL5 between the treatment block BL3 and the treatment block BL4.

In the relay block BL5, the delivery tower 55 is provided at the middle portion in the depth direction (X-direction in the drawing). The delivery tower 55 is concretely provided at a portion in the relay block BL5 between the transfer path R8 of the treatment block BL3 and the transfer path R9 of the treatment block BL4. In the delivery tower 55, the plurality of delivery apparatuses (not illustrated) are provided in a manner to be stacked in the vertical direction.

In the case of this example, a relay transfer system 4B may be connected to the relay block BL5, specifically, a transfer path 130B of the relay transfer system 4B may be connected to the relay block BL5. In other words, in the case where the transfer path 130B of the relay transfer system 4B is connected to a portion, of the wet treatment system 2B, farther away from the exposure apparatus E than the treatment block BL4, the other treatment block BL3 may exist at a portion farther away from the exposure apparatus E than the former portion.

In the case where the relay transfer system 4B is connected to the relay block BL5, the delivery tower 52 (see FIG. 1) is omitted from the delivery block BL2A and, instead, a delivery tower 56 is provided at an end portion on the deep side (X-direction positive side in FIG. 8) in the relay block BL5. In the delivery tower 56, a plurality of delivery apparatuses (not illustrated) are provided in a manner to be stacked in the vertical direction. The delivery tower 56 may have a cooling apparatus. Further, in this example, a transfer apparatus R12 is arranged between the delivery tower 55 and the delivery tower 56 in the relay block BL5. The transfer apparatus R12 can transfer the wafer W between the plurality of delivery apparatuses in the delivery tower 55 and the plurality of delivery apparatuses in the delivery tower 56.

Further, in this example, a transfer apparatus 131B arranged in a transfer path 130B of the relay transfer system 4B can transfer the wafer W between the delivery apparatuses in the delivery tower 56 and the load lock apparatus 110 while holding the wafer W by a transfer arm 131Ba.

Figure 9:
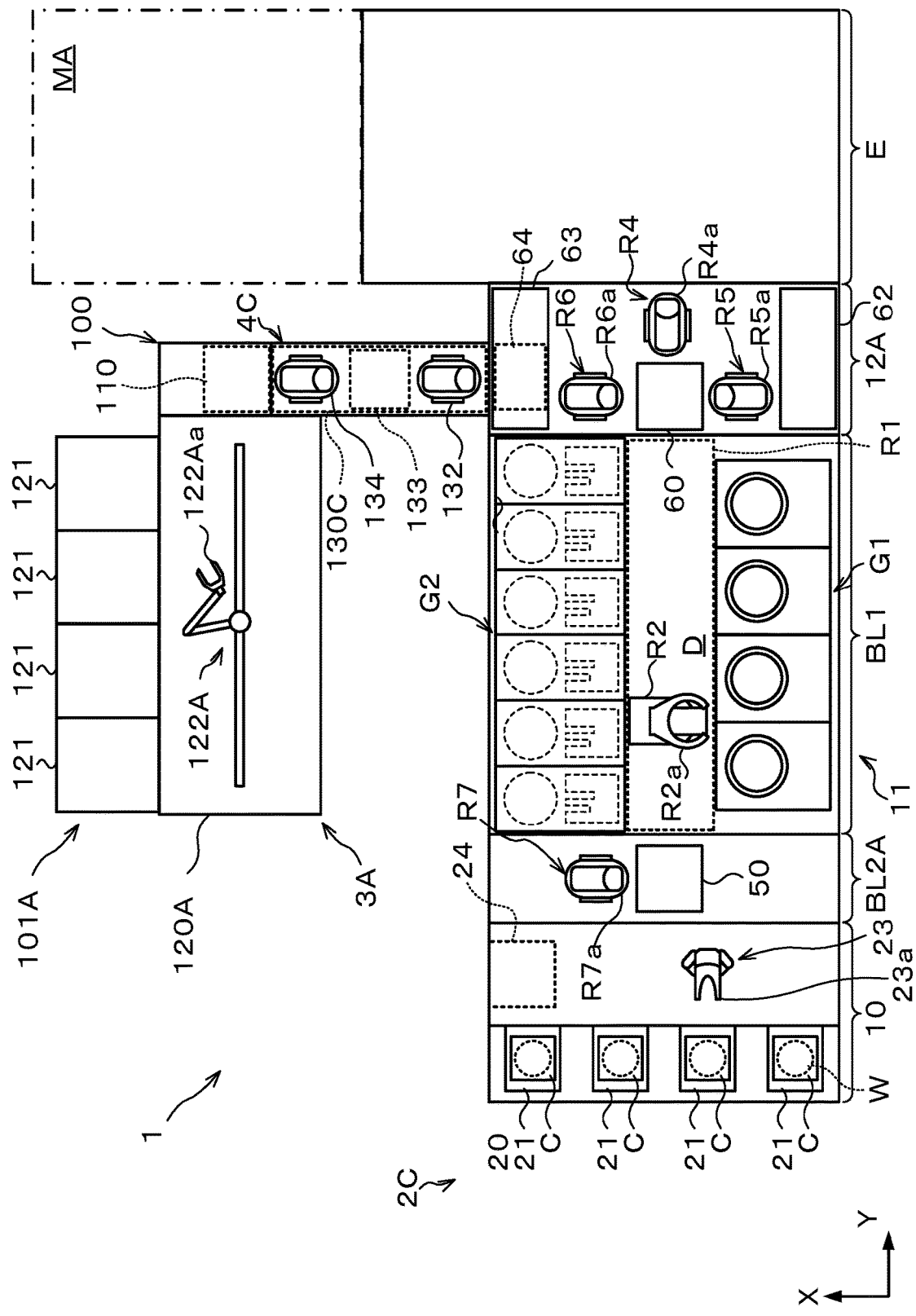
FIG. 9 is a view illustrating another example of the connecting portion of the relay transfer system to the wet treatment system.
Figure 10:
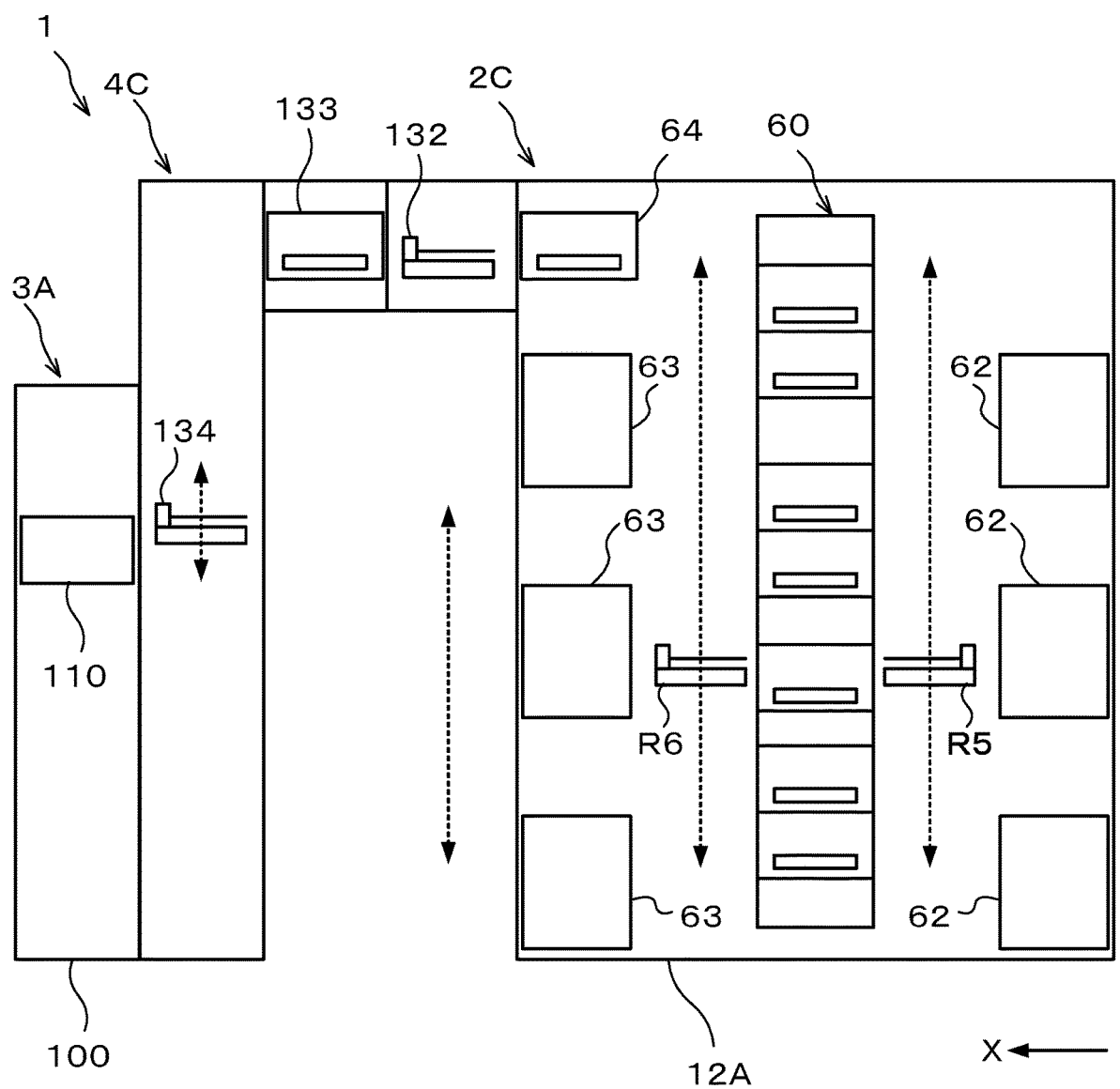
FIG. 10 is a view illustrating another example of the connecting portion of the relay transfer system to the wet treatment system.

Another Example 2 of a Connecting Portion of the Relay Transfer System to the Wet Treatment System FIG. 9 and FIG. 10 are views illustrating another example of a connecting portion of the relay transfer system to the wet treatment system.

As illustrated in FIG. 9 and FIG. 10, a connecting portion of a relay transfer system 4C to a wet treatment system 2C may be an interface station 12A. Specifically, a connecting portion of a transfer path 130C of the relay transfer system 4C to the wet treatment system 2C may be the interface station 12A.

In this example, the delivery apparatus 64 is provided at an end portion on the deep side (X-direction positive side in FIG. 9 and FIG. 10) of the interface station 12A. The delivery apparatus 64 is provided above the pre-exposure cleaning apparatus 63 as illustrated, for example, in FIG. 10. Note that in this example, the transfer apparatus R6 in the interface station 12A can also transfer the wafer W to the delivery apparatus 64.

Further, in this example, as illustrated in FIG. 9, in the transfer path 130C extending in the depth direction (X-direction in the drawing) in the relay transfer system 4C, a shuttle transfer apparatus 132, a delivery apparatus 133, and a transfer apparatus 134 are provided in order from the interface station 12A side along the depth direction in top view.

The shuttle transfer apparatus 132 and the delivery apparatus 133 are provided at the same height as that of the delivery apparatus 64 in the interface station 12A as illustrated in FIG. 10, and the shuttle transfer apparatus 132 transfers the wafer W between the delivery apparatus 133 and the delivery apparatus 64.

The transfer apparatus 134 can transfer the wafer W between the delivery apparatus 133 and the load lock apparatus 110 in the dry treatment system 3A.

The relay transfer system 4C is configured as above, and therefore a portion corresponding to the pre-exposure cleaning apparatus 63 on the front side (X-direction negative side in FIG. 10) is a vacant space. Accordingly, it is possible to prevent the work (for example, a maintenance work) by the worker for the pre-exposure cleaning apparatus 63 from being hindered by the relay transfer system 4C.

Note that the dry treatment system in this example is not limited to the example illustrated in FIG. 9, but may be configured, for example, as the dry treatment system 3 in FIG. 1.

Second Embodiment

Figure 11:
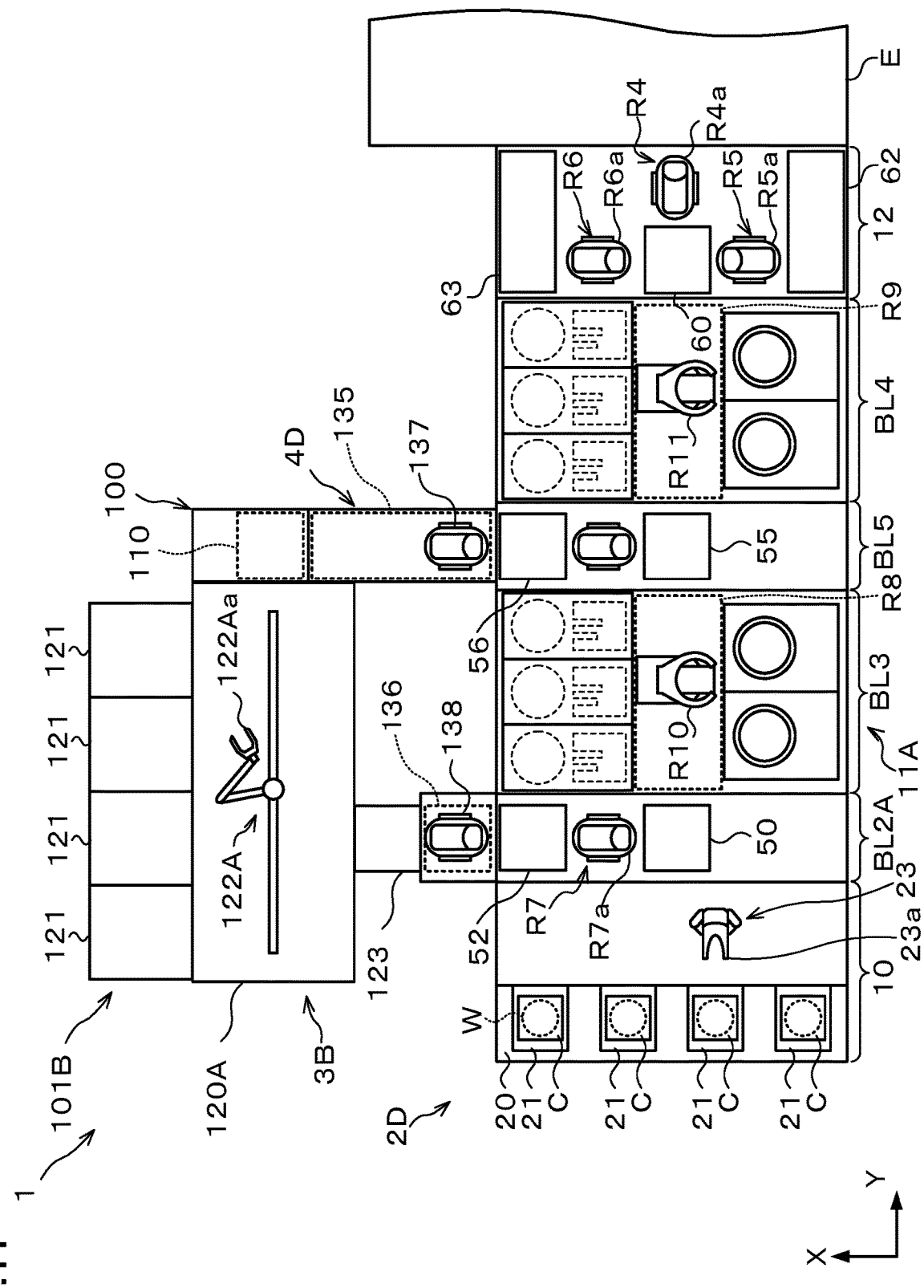
FIG. 11 is an explanatory view illustrating the outline of an internal configuration of a wafer treatment system as a substrate treatment system according to a second embodiment.

FIG. 11 is an explanatory view illustrating the outline of an internal configuration of a wafer treatment system as a substrate treatment system according to a second embodiment.

In the first embodiment explained using FIG. 1 and so on, the relay transfer system has one transfer path. In contrast, in this embodiment, a relay transfer system 4D has two transfer paths such as an outward transfer path 135 for transferring the wafer W from the wet treatment system 2 to the dry treatment system 3 and a homeward transfer path 136 for transferring the wafer W from the dry treatment system 3 to the wet treatment system 2 as illustrated in FIG. 11.

The outward transfer path 135 is connected, for example, to a relay block BL5 in a treatment station 11A in a wet treatment system 2D. Further, in the outward transfer path 135, a transfer apparatus 137 is arranged. The transfer apparatus 137 can transfer the wafer W between a plurality of delivery apparatuses in a delivery tower 56 in the relay block BL5 and a load lock apparatus 110 in a dry treatment system 3B.

The homeward transfer path 136 is connected, for example, to a delivery block BL2A in the treatment station 11A in the wet treatment system 2D. Further, in the homeward transfer path 136, a transfer apparatus 138 is arranged. The transfer apparatus 138 can transfer the wafer W between a plurality of delivery apparatuses 53 and a cooling apparatus 54 in the delivery tower 52 in the delivery block BL2A and a later-explained load lock apparatus 123 in the dry treatment system 3B.

In the case of this embodiment, the dry treatment system 3B has the load lock apparatus 123 through which the wafer W after being subjected to the dry developing treatment passes, in addition to the load lock apparatus 110 through which the wafer W before being subjected to the dry developing treatment passes.

The load lock apparatus 110 is provided in the load lock station 100 in the dry treatment system 3B and arranged adjacent to the deep side (X-direction positive side in the drawing) of the outward transfer path 135 of the relay transfer system 4D. In contrast, the load lock apparatus 123 is provided in a treatment station 101B of the dry treatment system 3B and arranged between a vacuum transfer chamber 120A in the treatment station 101B and the homeward transfer path 136 of the relay transfer system 4D. In other words, the load lock apparatus 123 is arranged adjacent to the front side (X-direction negative side in the drawing) of the vacuum transfer chamber 120A and adjacent to the deep side (X-direction positive side in the drawing) of the homeward transfer path 136 of the relay transfer system 4D. In this case, the transfer apparatus 122A in the vacuum transfer chamber 120A can transfer the wafer W also to the load lock apparatus 123.

In this embodiment, the same effects as the above-explained main effects in the first embodiment can be obtained. Further, in this embodiment, the transfer apparatus in the wet treatment system 2D involved in the transfer from the wet treatment system 2D to the dry treatment system 3B and the transfer apparatus in the wet treatment system 2D involved in the transfer from the dry treatment system 3B to the wet treatment system are different. Therefore, the productive efficiency of the treatments in the wet treatment system is high. Further, the efficiency of the parallel treatments of the wet developing treatment and the dry developing treatment on separate wafers W are also high.

Modification Example of the Second Embodiment

Figure 12:
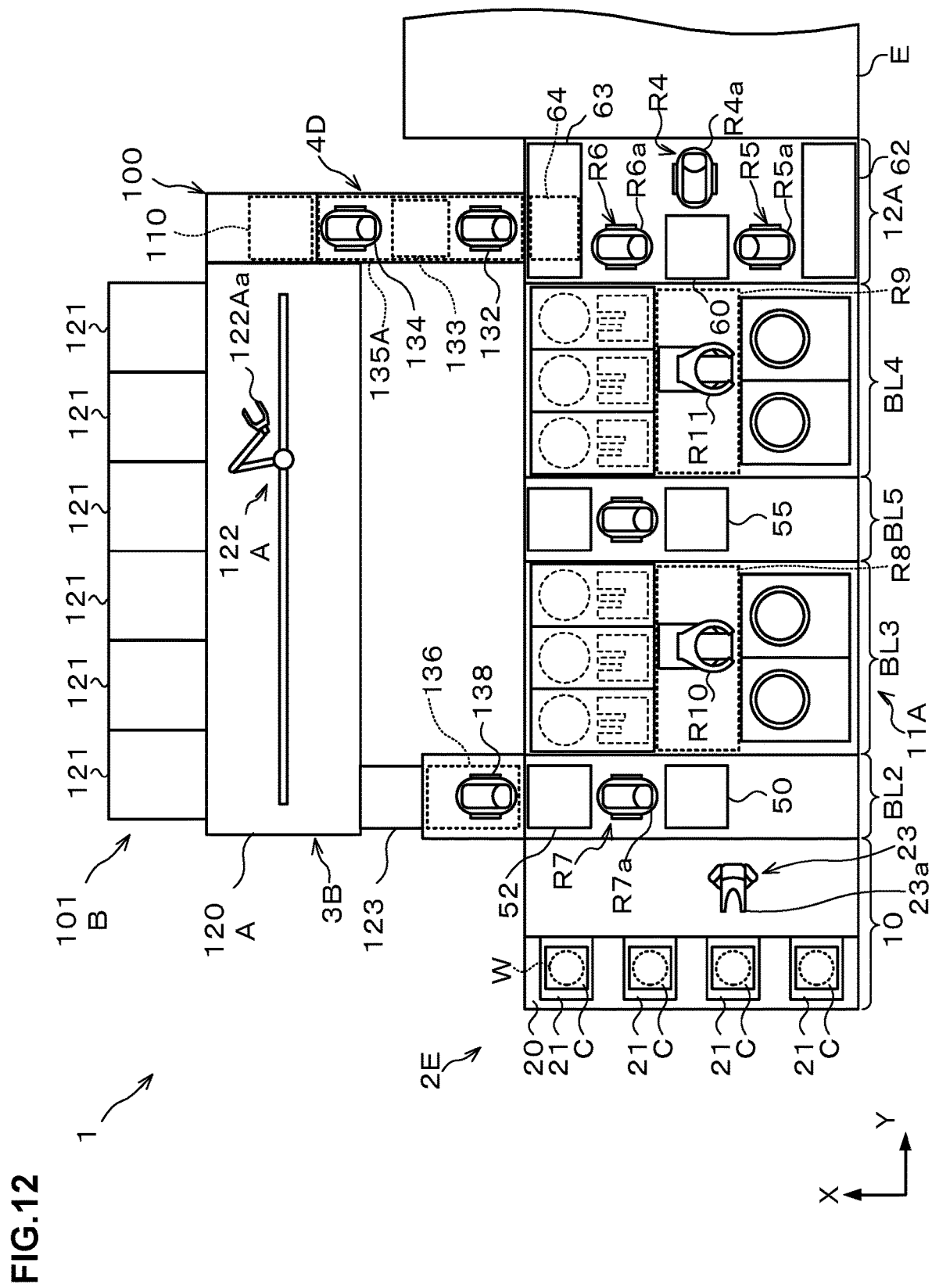
FIG. 12 is a view for explaining a modification example of the wafer treatment system as the substrate treatment system according to the second embodiment.

FIG. 12 is a view for explaining a modification example of the wafer treatment system as the substrate treatment system according to the second embodiment.

In the example in FIG. 11, the outward transfer path 135 of the relay transfer system 4D is connected to the relay block BL5 in the treatment station 11A in the wet treatment system 2D. However, as illustrated in FIG. 12, an outward transfer path 135A may be connected to an interface station 12A in a wet treatment system 2E as with the transfer path 130C illustrated in FIG. 9.

In this case, in the outward transfer path 135A, a shuttle transfer apparatus 132, a delivery apparatus 133, and a transfer apparatus 134 are provided as in, for example, the transfer path 130C illustrated in FIG. 9.

Third Embodiment

Figure 13:
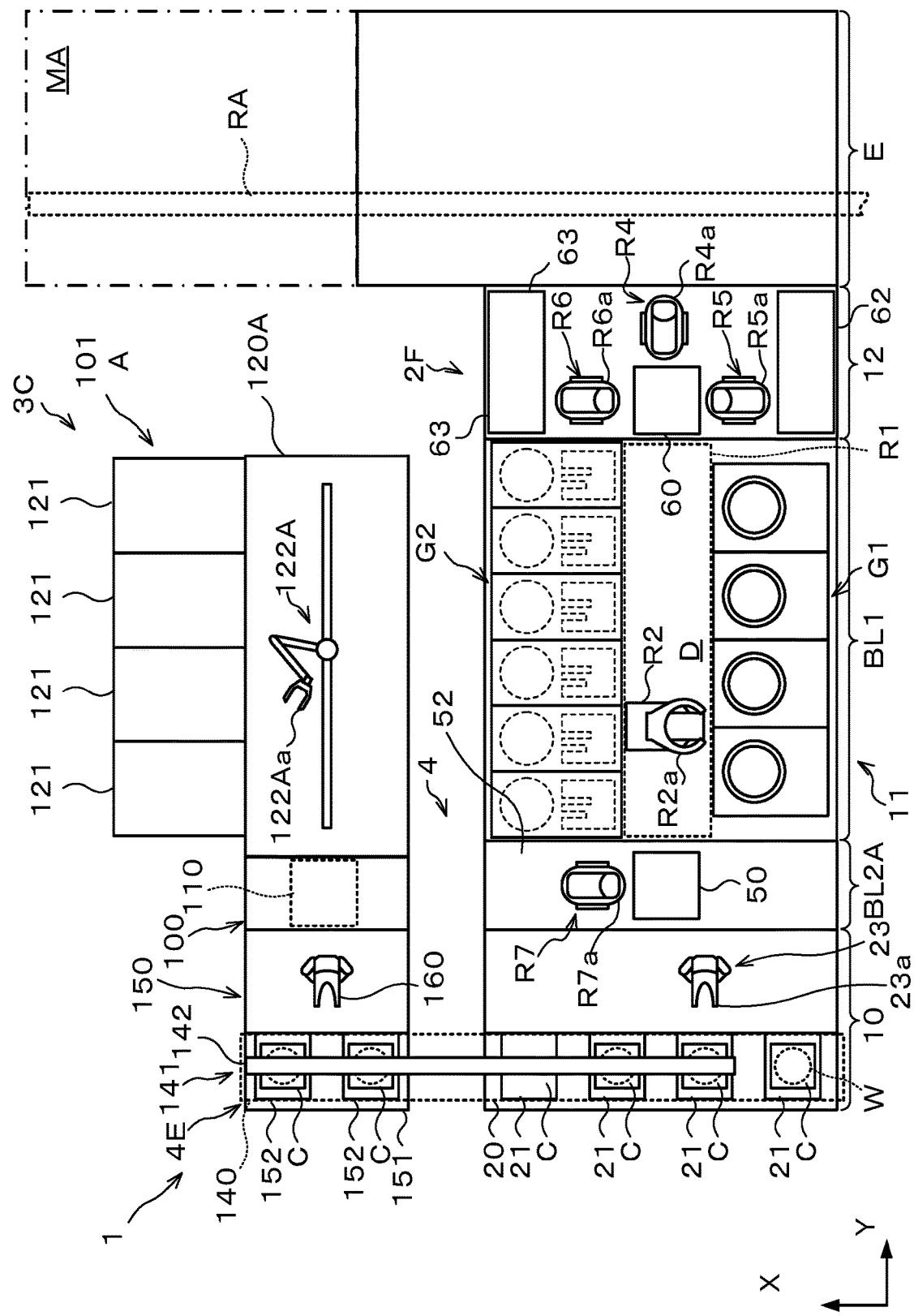
FIG. 13 is an explanatory view illustrating the outline of an internal configuration of a wafer treatment system as a substrate treatment system according to a third embodiment.
Figure 14:
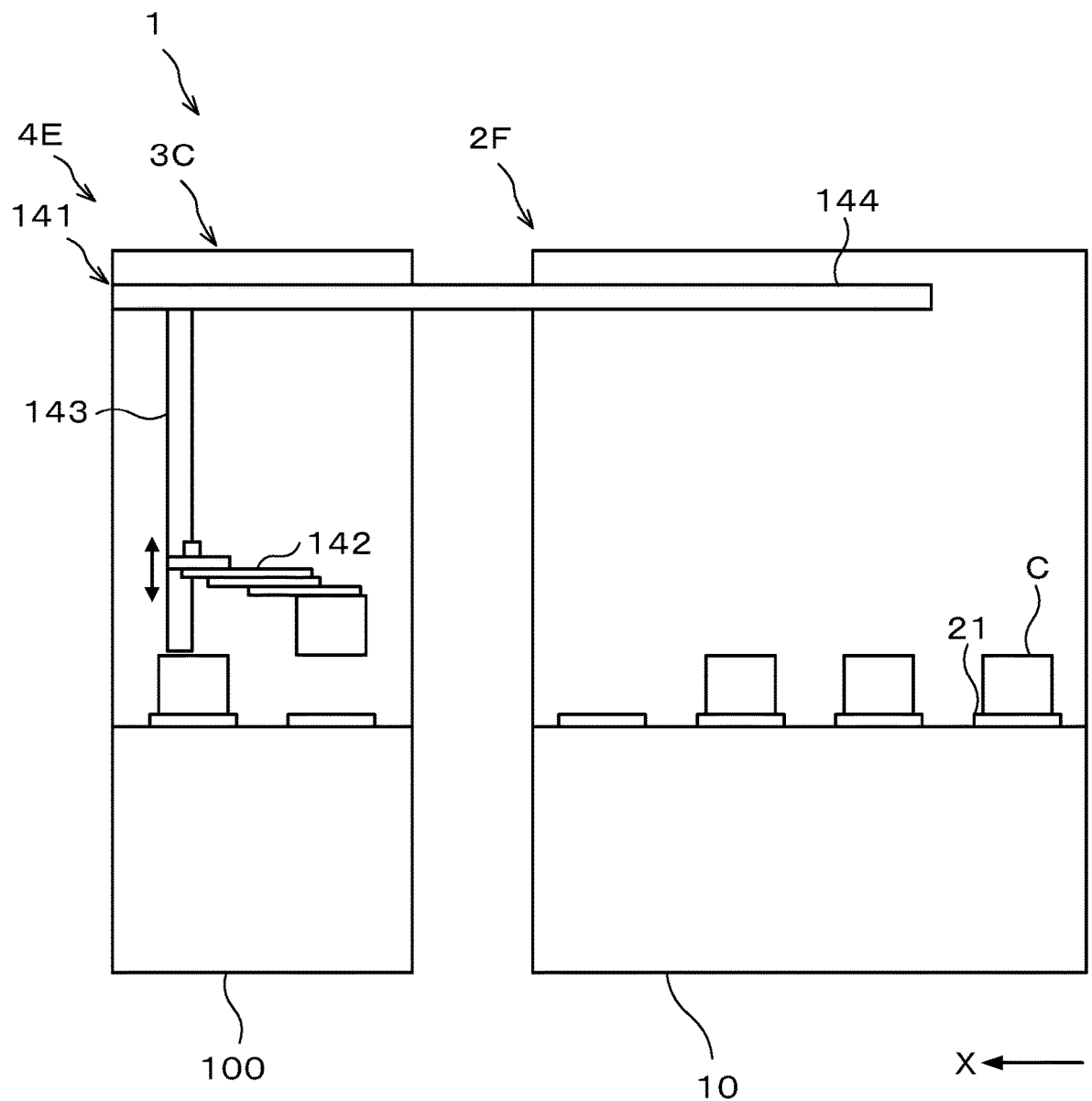
FIG. 14 is a view illustrating an appearance of the wafer treatment system in FIG. 13 from a cassette station side.

FIG. 13 is an explanatory view illustrating the outline of an internal configuration of a wafer treatment system as a substrate treatment system according to a third embodiment. FIG. 14 is a view illustrating an appearance of the wafer treatment system in FIG. 13 viewed from the cassette station side.

In the first embodiment and the second embodiment, the relay transfer system transfers the wafer \V in units of a wafer. In contrast, in this embodiment, a relay transfer system 4E in FIG. 13 and FIG. 14 transfers the wafers W in units of a cassette C. Specifically, the relay transfer system 4E in FIG. 13 and FIG. 14 transfers the wafers W in units of a cassette C between a wet treatment system 2F and a dry treatment system 3C. In the case of performing some treatments in the wet treatment system 2F and then performing the treatments in the dry treatment system 3C, for example, the treatments to be performed by the wet treatment system 2F are completed, and then the wafers W are stored in the cassette C on the cassette stage 20 in the wet treatment system 2F. Thereafter, the wafers W are transferred in units of a cassette C to the dry treatment system 3C, and subjected to the treatments in the dry treatment system 3C. After the completion of the treatments in the dry treatment system 3C, the wafers W are, for example, returned to the wet treatment system 2F in units of a cassette C.

The relay transfer system 4E has, for example, as illustrated in FIG. 13, a transfer region 140 extending in the depth direction (X-direction in the drawing), and a transfer apparatus 141 is provided in the transfer region 140. The transfer apparatus 141 has, as illustrated in FIG. 14, an articulated arm 142 which is configured to hold the cassette C, a pillar part 143 which supports the articulated arm 142 to be movable in the vertical direction, and a rail 144 which supports the pillar part 143 to be movable in the depth direction (X-direction in the drawing). The rail 144 is provided extending along the depth direction (X-direction in the drawing).

In the case of this embodiment, the dry treatment system 3C has a cassette station 150 to/from which the cassette C is transferred in/out, on the side, of the load lock station 100, opposite to a treatment station 101A.

In the cassette station 150, for example, a cassette stage 151 is provided at an end portion on the width direction one side (Y-direction negative side in FIG. 13). On the cassette stage 151, a plurality of, for example, two stage plates 152 are provided. The stage plates 152 are provided side by side in a row in the depth direction (X-direction in FIG. 13). On the stage plates 152, the cassettes C can be mounted when the cassettes C are transferred in/out from/to the outside of the dry treatment system 3C.

Further, in the cassette station 150, a transfer apparatus 160 which transfers the wafer W is provided, for example, on a width direction other side (Y-direction positive side in FIG. 13). The transfer apparatus 160 can transfer the wafer W between the cassette C on each of the stage plates 152 and the load lock apparatus 110.

Note that also the dry treatment system in this example is not limited to the example illustrated FIG. 13 and FIG. 14. For example, the dry treatment system may be the one in which the cassette station 150 or the one corresponding thereto is connected at a position on the side opposite to the treatment station 101 in the load lock station 100 in the dry treatment system 3 in FIG. 1.

Other Modification Examples

In the above example, the treatments performed in the wet mode by the wet treatment system and performed in the dry mode by the dry treatment system are developing treatments but only need to be treatments for photolithography, and may be, for example, a formation treatment of a film for photolithography such as a resist film and a cleaning treatment of the wafer W.

Further, in the above example, the wafer W is subjected to the treatments in the wet treatment system and then transferred into the dry treatment system and, after the completion of the dry treatments, transferred to return again into the wet treatment system, with which the treatment step is completed. However, not limited to this example, for example, after the completion of the dry treatments on the wafer W in the dry treatment system, the wafer W may be stored in the cassette mounted in the dry treatment system without being transferred into the wet treatment system, with which the preparation for transferring the wafer W to the outside may be completed.

The embodiments disclosed herein are examples in all respects and should not be considered to be restrictive. Various omissions, substitutions and changes may be made in the embodiment without departing from the scope and spirit of the attached claims. For example, configuration requirements of the above embodiments can be arbitrarily combined. The operations and effects about the configuration requirements relating to the combination can be obtained as a matter of course from the arbitrary combination, and those skilled in the art can obtain clear other operations and effects from the description herein.

The effects described herein are merely explanatory or illustrative in all respects and not restrictive. The technique relating to this disclosure can offer other clear effects to those skilled in the art from the description herein in addition to or in place of the above effects.

Note that the following configuration examples also belong to the technical scope of this disclosure.

(1) A substrate treatment system including:
   a wet treatment system having a wet treatment apparatus configured to perform in a wet mode one of substrate treatments from a formation treatment of a resist film on a substrate to a developing treatment of the resist film after exposure, and coupled to an exposure apparatus;
   a dry treatment system having a dry treatment apparatus configured to perform in a dry mode a same kind of substrate treatment as the wet treatment apparatus; and
   a relay transfer system configured to transfer the substrate between the wet treatment system and the dry treatment system, wherein:
   when viewed from a coupling direction of the wet treatment system and the exposure apparatus, the wet treatment system is arranged such that the exposure apparatus projects from one side in a depth direction perpendicular to the coupling direction in top view; and
   the dry treatment system is arranged to be adjacent to the one side of the wet treatment system in the depth direction.

(2) The substrate treatment system according to (1), wherein:
   a plurality of the wet treatment apparatuses are arranged to line up along a transfer path extending in the coupling direction; and
   the substrate is transferred between the wet treatment system and the dry treatment system via a transfer route extending in the depth direction including a transfer path of the relay transfer system.

(3) The substrate treatment system according to (1) or (2), wherein
   the relay transfer system is connected to a portion, of the wet treatment system, farther away from the exposure apparatus than a treatment block including the wet treatment apparatus.

(4) The substrate treatment system according to any one of (1) to (3), wherein the relay transfer system is connected to a portion, of the wet treatment system, closer to the exposure apparatus than a treatment block including the wet treatment apparatus.

(5) The substrate treatment system according to any one of (1) to (3), wherein:
the relay transfer system includes an outward transfer path for transferring the substrate from the wet treatment system to the dry treatment system, and a homeward transfer path for transferring the substrate from the dry treatment system to the wet treatment system; and
the outward transfer path and the homeward transfer path are connected to different portions of the wet treatment system.

(6) The substrate treatment system according to (4), wherein:
the relay transfer system includes an outward transfer path for transferring the substrate from the wet treatment system to the dry treatment system, and a homeward transfer path for transferring the substrate from the dry treatment system to the wet treatment system; and
the outward transfer path and the homeward transfer path are connected to different portions of the wet treatment system.

(7) The substrate treatment system according to (6), wherein
the homeward transfer path is connected to a portion, of the wet treatment system, farther away from the exposure apparatus than the treatment block.

(8) The substrate treatment system according to any one of (1) to (3), wherein
the relay transfer system transfers the substrates in units of a housing container configured to be capable of housing a plurality of substrates.

(9) The substrate treatment system according to any one of (1) to (8), wherein
a transfer path of the relay transfer system has one end connected to the wet treatment system, and another end not directly connected to the exposure apparatus but connected to the exposure apparatus via the wet treatment system.

(10) A substrate treatment method for performing a substrate treatment,
the substrate treatment being one of treatments from a formation treatment of a resist film on a substrate to a developing treatment of the resist film after exposure,
a wet treatment system having a wet treatment apparatus configured to perform in a wet mode the substrate treatment and a dry treatment system having a dry treatment apparatus configured to perform in a dry mode a same kind of treatment as the wet treatment apparatus being arranged adjacent to each other,
the substrate treatment method including selectively transferring the substrate to either the wet treatment system or the dry treatment system.

According to this disclosure, it is possible to provide a substrate treatment system which includes a treatment system for performing treatments for photolithography other than an exposure treatment and is connected to an exposure apparatus, the system being high in productivity.

What is claimed is:
1. A substrate treatment system comprising:
a wet treatment system having a wet treatment apparatus configured to perform, using a liquid, one of substrate treatments from a formation treatment of a resist film on a substrate to a developing treatment of the resist film after exposure, and coupled to an exposure apparatus;
a dry treatment system having a dry treatment apparatus configured to perform, using a gas, the substrate treatment performed by the wet treatment apparatus using the liquid; and
a relay transfer system configured to transfer the substrate between the wet treatment system and the dry treatment system, wherein:
when viewed from a coupling direction of the wet treatment system and the exposure apparatus, the wet treatment system is arranged such that the exposure apparatus projects from one side in a depth direction perpendicular to the coupling direction in top view; and
the dry treatment system is arranged to be adjacent to the one side of the wet treatment system in the depth direction.

2. The substrate treatment system according to claim 1, wherein:
a plurality of the wet treatment apparatuses are arranged to line up along a transfer path extending in the coupling direction; and
the substrate is transferred between the wet treatment system and the dry treatment system via a transfer route extending in the depth direction including a transfer path of the relay transfer system.

3. The substrate treatment system according to claim 1, wherein
the relay transfer system is connected to a portion, of the wet treatment system, farther away from the exposure apparatus than a treatment block including the wet treatment apparatus.

4. The substrate treatment system according to claim 1, wherein
the relay transfer system is connected to a portion, of the wet treatment system, closer to the exposure apparatus than a treatment block including the wet treatment apparatus.

5. The substrate treatment system according to claim 1, wherein:
the relay transfer system includes an outward transfer path for transferring the substrate from the wet treatment system to the dry treatment system, and a homeward transfer path for transferring the substrate from the dry treatment system to the wet treatment system; and
the outward transfer path and the homeward transfer path are connected to different portions of the wet treatment system.

6. The substrate treatment system according to claim 4, wherein:
the relay transfer system includes an outward transfer path for transferring the substrate from the wet treatment system to the dry treatment system, and a homeward transfer path for transferring the substrate from the dry treatment system to the wet treatment system; and
the outward transfer path and the homeward transfer path are connected to different portions of the wet treatment system.

7. The substrate treatment system according to claim 6, wherein
the homeward transfer path is connected to a portion, of the wet treatment system, farther away from the exposure apparatus than the treatment block.

8. The substrate treatment system according to claim 1, wherein the relay transfer system transfers the substrates in units of a housing container configured to be capable of housing a plurality of substrates.

9. The substrate treatment system according to claim 1, wherein
a transfer path of the relay transfer system has one end connected to the wet treatment system, and another end not directly connected to the exposure apparatus but connected to the exposure apparatus via the wet treatment system.

10. A substrate treatment method for performing a substrate treatment,
the substrate treatment being one of treatments from a formation treatment of a resist film on a substrate to a developing treatment of the resist film after exposure, the substrate treatment method comprising:
providing a wet treatment system having a wet treatment apparatus configured to perform, using a liquid, the substrate treatment and a dry treatment system having a dry treatment apparatus configured to perform, using a gas, the substrate treatment performed by the wet treatment apparatus using the liquid, the wet treatment system and the dry treatment system being arranged adjacent to each other, and
selectively transferring the substrate to either the wet treatment system or the dry treatment system.

11. The substrate treatment method according to claim 10, wherein:
a plurality of the wet treatment apparatuses are arranged to line up along a transfer path extending in a coupling direction of the wet treatment system and the exposure apparatus;
wherein the substrate is selectively transferred between the wet treatment system and the dry treatment system via a transfer route extending in a depth direction perpendicular to the coupling direction in top view including a transfer path of a relay transfer system.

12. The substrate treatment method according to claim 10, wherein
a relay transfer system is connected to a portion, of the wet treatment system, farther away from the exposure apparatus than a treatment block including the wet treatment apparatus, and
the selectively transferring is performed by the relay transfer system.

13. The substrate treatment method according to claim 10, wherein
a relay transfer system is connected to a portion, of the wet treatment system, closer to the exposure apparatus than a treatment block including the wet treatment apparatus, and
the selectively transferring is performed by the relay transfer system.

14. The substrate treatment method according to claim 10, wherein:
a relay transfer system includes an outward transfer path for transferring the substrate from the wet treatment system to the dry treatment system, and a homeward transfer path for transferring the substrate from the dry treatment system to the wet treatment system; and the outward transfer path and the homeward transfer path are connected to different portions of the wet treatment system, and
the selectively transferring is performed by the relay transfer system.

15. The substrate treatment method according to claim 13, wherein:
the relay transfer system includes an outward transfer path for transferring the substrate from the wet treatment system to the dry treatment system, and a homeward transfer path for transferring the substrate from the dry treatment system to the wet treatment system; and
the outward transfer path and the homeward transfer path are connected to different portions of the wet treatment system.

16. The substrate treatment method according to claim 15, wherein
the homeward transfer path is connected to a portion, of the wet treatment system, farther away from the exposure apparatus than the treatment block.

17. The substrate treatment method according to claim 10, wherein
the selectively transferring is performed by relay transfer system that transfers the substrates in units of a housing container configured to be capable of housing a plurality of substrates.

18. The substrate treatment method according to claim 10, wherein
the selectively transferring is performed by relay transfer system in which a transfer path of the relay transfer system has one end connected to the wet treatment system, and another end not directly connected to the exposure apparatus but connected to the exposure apparatus via the wet treatment system.

* * * * *